United States Patent
Allen et al.

(10) Patent No.: US 6,686,616 B1
(45) Date of Patent: Feb. 3, 2004

(54) SILICON CARBIDE METAL-SEMICONDUCTOR FIELD EFFECT TRANSISTORS

(75) Inventors: Scott T. Allen, Apex, NC (US); John W. Palmour, Raleigh, NC (US); Terrence S. Alcorn, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 09/567,717

(22) Filed: May 10, 2000

(51) Int. Cl.$^7$ ................................................ H01L 29/80
(52) U.S. Cl. ...................... 257/280; 257/77; 257/284; 257/287; 257/472
(58) Field of Search ........................ 257/77, 280, 284, 257/287, 472

(56) References Cited

U.S. PATENT DOCUMENTS

| | | | |
|---|---|---|---|
| 3,903,592 A | * 9/1975 | Heckl | 29/578 |
| 4,732,871 A | 3/1988 | Buchmann et al. | 437/41 |
| 4,757,028 A | 7/1988 | Kondoh et al. | 437/40 |
| 4,762,806 A | 8/1988 | Suzuki et al. | 437/100 |
| 4,897,710 A | 1/1990 | Suzuki et al. | 357/71 |

(List continued on next page.)

FOREIGN PATENT DOCUMENTS

| | | | | |
|---|---|---|---|---|
| EP | 0 518 683 A1 | 12/1992 | | |
| EP | 19900169 | * 7/1999 | | |
| JP | 47-5124 | 3/1972 | | |
| JP | 54-155482 | 10/1979 | | |
| JP | 59-134874 | * 8/1984 | | |
| JP | 60-142568 | 2/1985 | | |
| JP | 60-154674 | 8/1985 | | |
| JP | 63-47983 | 2/1988 | | |
| JP | 63047983 | 2/1988 | | |
| JP | 1106476 | 4/1989 | | |
| JP | 1106477 | 4/1989 | | |
| JP | 1-196873 | * 8/1989 | | |
| JP | 1308876 | 12/1989 | | |
| JP | 2-10772 | 1/1990 | | |
| JP | 9-36359 | * 2/1997 | | |
| WO | WO 01/67521 A1 | 9/2001 | | H01L/29/872 |
| WO | WO 01/86727 A2 | 11/2001 | | H01L/29/24 |

OTHER PUBLICATIONS

Hilton et al. "Suppression of Instabilities in 4H–SiC Microwave MESFETs" 2000 $8^{th}$ IEEE international Symposium.*
A. O. Evwaraye et al. "Examination of electrical and optical properties of vanadium in bulk n–type silicon carbide" J. Appl. Phys. 76 (10), 1994.*
S.M. Sze, *Physics of Semiconductor Devices*. Chapter 6.4, pp. 341–347, (Date illegible).

(List continued on next page.)

*Primary Examiner*—Nathan J. Flynn
*Assistant Examiner*—Ahmed N. Sefer
(74) *Attorney, Agent, or Firm*—Myers Bigel Sibley & Sajovec PA

(57) ABSTRACT

SiC MESFETs are disclosed which utilize a semi-insulating SiC substrate which substantially free of deep-level dopants. Utilization of the semi-insulating substrate may reduce back-gating effects in the MESFETs. Also provided are SiC MESFETs with a two recess gate structure. MESFETS with a selectively doped p-type buffer layer are also provided. Utilization of such a buffer layer may reduce output conductance by a factor of 3 and produce a 3 db increase in power gain over SiC MESFETs with conventional p-type buffer layers. A ground contact may also be provided to the p-type buffer layer and the p-type buffer layer may be made of two p-type layers with the layer formed on the substrate having a higher dopant concentration. SiC MESFETs according to embodiments of the present invention may also utilize chromium as a Schottky gate material. Furthermore, an oxide-nitride-oxide (ONO) passivation layer may be utilized to reduce surface effects in SiC MESFETs. Also, source and drain ohmic contacts may be formed directly on the n-type channel layer, thus, the $n^+$ regions need not be fabricated and the steps associated with such fabrication may be eliminated from the fabrication process. Methods of fabricating such SiC MESFETs and gate structures for SiC FETs as well as passivation layers are also disclosed.

122 Claims, 10 Drawing Sheets

U.S. PATENT DOCUMENTS

| | | | |
|---|---|---|---|
| 4,947,218 A | | 8/1990 | Edmond et al. ............... 357/13 |
| 5,229,625 A | | 7/1993 | Suzuki et al. ................. 257/77 |
| 5,264,713 A | * | 11/1993 | Palmour ..................... 257/77 |
| 5,270,554 A | * | 12/1993 | Palmour ..................... 257/77 |
| 5,396,085 A | | 3/1995 | Baliga ........................ 257/77 |
| 5,399,883 A | * | 3/1995 | Baliga ........................ 257/57 |
| 5,510,630 A | * | 4/1996 | Agarwaa et al. ............. 257/77 |
| 5,686,737 A | * | 11/1997 | Allen .......................... 257/77 |
| 5,719,409 A | * | 2/1998 | Singh et al. .................. 257/77 |
| 5,895,939 A | | 4/1999 | Ueno ........................ 257/279 |
| 5,900,648 A | | 5/1999 | Harris et al. ................. 257/77 |
| 5,925,895 A | | 7/1999 | Sriram et al. ................ 257/77 |
| 5,972,801 A | | 10/1999 | Lipkin et al. ............... 438/770 |
| 6,107,649 A | * | 8/2000 | Zhao .......................... 257/138 |
| 6,121,633 A | * | 9/2000 | Singh et al. .................. 257/77 |
| 6,218,680 B1 | * | 4/2001 | Carter, Jr. et al. ............ 257/77 |
| 6,316,793 B1 | * | 11/2001 | Sheppard et al. ........... 257/103 |
| 2003/0075719 A1 | * | 4/2003 | Sriram ........................ 257/77 |

OTHER PUBLICATIONS

H.S. Kong, et al. "Temperature dependence of the current–voltage characteristics of metal–semiconductor field–effect transistors in n–type β –SiC grown via chemical vapor deposition," *Applied Physics Letters*. vol. 5i, No. 5, (Aug. 10, 1987).

Galina Kelner, et al. "β –SiC MESFET's and Buried–Gate JFET's," *IEEE Electron Device Letters*. Vol. EDL–8, No. 9, (Sept. 1987).

Robert Soares. *GaAs MESFET Circuit Design*. pp. 7–9; 17–18, (1988).

J.W. Palmour, et al. "Characterization of device parameters in high–temperature metal–oxide–semiconductor field–effect transistors in β –SiC thin films," *Journal of Applied Physics*. vol. 64, No. 4, (Aug. 15, 1988).

Calvin H. Carter, et al. "Silicon Carbide and Related Materials—1999, Part 2," *Materials Science Forum*. vols. 338–342, pp. 1247–1266 (2000).

J.W. Palmour, et al. "High temperature depletion–mode metal–oxide–semiconductor field–effect transistors in beta–SiC thin films," *Applied Physics Letters*. vol. 51, No. 24, (Dec. 14, 1987).

J.W. Palmour, et al. "Ultrafast silicon–carbide rectifiers," *Powertechnics Magazine*. (Aug. 1989).

Jack Browne. "Top Products of 1999," *Microwaves& RF*. (Dec. 1999).

Gene Heftman. "Wireless Semi Technology Heads Into New Territory." *Microwaves & RF*. (Feb. 2000).

"A 10 W 2 GHz Silicon Carbide MESFET," *Microwave Journal*. (Sep. 1999).

"First Silicon Carbide Microwave Power Products are Introduced," *Applied Microwave & Wireless*.

"SiC MESFET Drives PCS Base Stations," *Wireless Systems Design*. (Oct. 1999).

S.T. Allen, et al. "Silicon Carbide MESFET's with 2 w/mm and 50% P.A.E. at 1.8 GHz," *Mtt Conference*. 1996.

International Search Report of PCT/US 01/04957 filed Feb. 15, 2001.

Ma, et al., "High Efficiency LDMOS Power FET for Low Voltage Wireless Communications" 1996 IEEE.

Yokogawa et al., *Electronic Properties of Nitrogen Delta–Doped Silicon Carbide Layers*, 2001 Mat. Res. Soc. Symp. Proc., vol. 640.

International Search Report of PCT/US 02/32204 dated Feb. 26, 2003.

* cited by examiner

SILICON CARBIDE METAL-SEMICONDUCTOR FIELD EFFECT TRANSISTORS

STATEMENT OF GOVERNMENT INTEREST

The present invention was made with Government support under contract number N00014-96-C-2152 awarded by the United States Office of Naval Research. The Government has certain rights in this invention.

FIELD OF THE INVENTION

The present invention relates microelectronic devices and more particularly to metal-semiconductor field-effect transistors (MESFETs) formed in silicon carbide.

BACKGROUND OF THE INVENTION

Electrical circuits requiring high power handling capability (>20 watts) while operating at high frequencies such as radio frequencies (500 MHz), S-band (3 GHz) and X-band (10 GHz) have in recent years become more prevalent. Because of the increase in high power, high frequency circuits there has been a corresponding increase in demand for transistors which are capable of reliably operating at radio frequencies and above while still being capable of handling higher power loads. Previously, bipolar transistors and power metal-oxide semiconductor field effect transistors (MOSFETs) have been used for high power applications but the power handling capability of such devices may be limited at higher operating frequencies. Junction field-effect transistors (JFETs) were commonly used for high frequency applications but the power handling capability of previously known JFETs also may be limited.

Recently, metal-semiconductor field effect transistors (MESFETs) have been developed for high frequency applications. The MESFET construction may be preferable for high frequency applications because only majority carriers carry current. The MESFET design may be preferred over current MOSFET designs because the reduced gate capacitance permits faster switching times of the gate input. Therefore, although all field-effect transistors utilize only majority carriers to carry current, the Schottky gate structure of the MESFET may make the MESFET more desirable for high frequency applications.

In addition to the type of structure—and perhaps more fundamentally—the characteristics of the semiconductor material from which a transistor is formed also affects the operating parameters. Of the characteristics which affect a transistor's operating parameters, the electron mobility, saturated electron drift velocity, electric breakdown field and thermal conductivity may have the greatest effect on a transistor's high frequency and high power characteristics.

Electron mobility is the measurement of how rapidly an electron is accelerated to its saturated velocity in the presence of an electric field. In the past, semiconductor materials which have a high electron mobility were preferred because more current could be developed with a lesser field, resulting in faster response times when a field is applied. Saturated electron drift velocity is the maximum velocity which an electron can obtain in the semiconductor material. Materials with higher saturated electron drift velocities are preferred for high frequency applications because the higher velocity translates to shorter times from source to drain.

Electric breakdown field is the field strength at which breakdown of the Schottky junction and the current through the gate of the device suddenly increases. A high electric breakdown field material is preferred for high power, high frequency transistors because larger electric fields generally can be supported by a given dimension of material. Larger electric fields allow for faster transients as the electrons can be accelerated more quickly by larger electric fields than by smaller.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

In the past, most high frequency MESFETs have been manufactured of n-type III–V compounds, such as gallium arsenide (GaAs) because of their high electron mobilities. Although these devices provided increased operating frequencies and moderately increased power handling capability, the relatively low breakdown voltage and the lower thermal conductivity of these materials have limited their usefulness in high power applications.

Silicon carbide (SiC) has been known for many years to have excellent physical and electronic properties which should theoretically allow production of electronic devices that can operate at higher temperatures, higher power and higher frequency than devices produced from silicon (Si) or GaAs. The high electric breakdown field of about $4 \times 10^6$ V/cm, high saturated electron drift velocity of about $2.0 \times 10^7$ cm/sec and high thermal conductivity of about 4.9 W/cm-°K indicate that SiC would be suitable for high frequency, high power applications. Unfortunately, difficulty in manufacturing has limited the usefulness of SiC for high power and high frequency applications.

Recently, MESFETs having channel layers of silicon carbide have been produced on silicon substrates (see U.S. Pat. No. 4,762,806 to Suzuki et al and U.S. Pat. No. 4,757,028 to Kondoh et al). Because the semiconductor layers of a MESFET are epitaxial, the layer upon which each epitaxial layer is grown affects the characteristics of the device. Thus, a SiC epitaxial layer grown on a Si substrate generally has different electrical and thermal characteristics then a SiC epitaxial layer grown on a different substrate. Although the SiC on Si substrate devices described in U.S. Pat. Nos. 4,762,806 and 4,757,028 may have exhibited improved thermal characteristics, the use of a Si substrate generally limits the ability of such devices to dissipate heat. Furthermore, the growth of SiC on Si generally results in defects in the epitaxial layers which result in high leakage current when the device is in operation.

Other MESFETs have been developed using SiC substrates. U.S. patent application Ser. No. 07/540,488 filed Jun. 19, 1990 and now abandoned, the disclosure of which is incorporated entirely herein by reference, describes a SiC MESFET having epitaxial layers of SiC grown on a SiC substrate. These devices exhibited improved thermal characteristics over previous devices because of the improved crystal quality of the epitaxial layers grown on SiC substrates. However, to obtain high power and high frequency it may be necessary to overcome the limitations of SiC's lower electron mobility.

Similarly, commonly assigned U.S. Pat. No. 5,270,554 to co-inventor Palmour describes a SiC MESFET having source and drain contacts formed on n+ regions of SiC and an optional lightly doped epitaxial layer between the substrate and the n-type layer in which the channel is formed. U.S. Pat. No. 5,925,895 to Sriram et al. also describes a SiC MESFET and a structure which is described as overcoming "surface effects" which may reduce the performance of the MESFET for high frequency operation. Sriram et al. also describes SiC MESFETs which use n+ source and drain contact regions as well as a p-type buffer layer. However, despite the performance reported in these patents, further improvements may be made in SiC MESFETs.

SUMMARY OF THE INVENTION

Embodiments of the present invention may provide SiC MESFETs formed on a semi-insulating substrate of SiC where the SiC substrate is substantially free of deep level dopants. Forming SiC MESFETs on such semi-insulating substrates may improve performance by reducing back-gating effects which may result from the presence of deep level dopants in the substrate. Buffer layers of p-type, n-type or undoped SiC may be utilized with such semi-insulating SiC substrates in the formation of MESFETs according to embodiments of the present invention.

In additional embodiments of the present invention, a two recess gate structure may be utilized where a cap layer of n-type SiC is formed on an n-type SiC channel layer. A recess is formed in the cap layer and a second recess is formed in the n-type channel layer by forming the second recess in the recess in the cap layer. The Schottky gate contact may then be formed in the second recess.

Further embodiments of the present invention may be provided by SiC MESFETs which utilize a selectively doped p-type buffer layer, where the p-type buffer layer has a carrier concentration of from about $1 \times 10^{16}$ to about $1 \times 10^{17}$ cm$^{-3}$ and more preferably from about 3 to about $5 \times 10^{16}$ cm$^{-3}$. Utilization of such a buffer layer has unexpectedly been found to reduce output conductance by a factor of 3 and produce a 3 db increase in power gain over SiC MESFETs with conventional p-type buffer layers.

SiC MESFETs according to embodiments of the present invention may also utilize chromium as a Schottky gate material. Furthermore, an oxide-nitride-oxide (ONO) passivation layer may be utilized to reduce surface effects in SiC MESFETs. Also, source and drain ohmic contacts may be formed directly on the n-type channel layer, thus, the n+ regions need not be fabricated and the steps associated with such fabrication may be eliminated from the fabrication process.

Additionally, if a p-type buffer layer is utilized, a contact may be formed to the p-type buffer layer so as to allow grounding of the p-type buffer layer. The contact may be formed on a p+ well region formed in the p-type buffer layer. Optionally, the p-type buffer layer may be formed by two p-type layers where the first layer formed on the substrate has a higher doping level than the second layer which is formed on the first p-type layer.

Particular embodiments of the present invention may provide a high power, high frequency, metal-semiconductor field-effect transistor having a bulk single crystal silicon carbide substrate and an n-type epitaxial layer of n-type conductivity silicon carbide on the substrate. A p-type epitaxial layer of selectively doped p-type conductivity silicon carbide is provided between the substrate and the n-type epitaxial layer. The transistor may also include ohmic contacts for defining a source and a drain as well as a Schottky metal contact.

In other embodiments of the present invention, a high power, high frequency, metal-semiconductor field-effect transistor may be provided having an n-type layer of n-type conductivity silicon carbide on a silicon carbide substrate and a p-type layer of p-type conductivity silicon carbide between the substrate and the n-type layer. Ohmic contacts are provided on portions of the n-type layer and spaced apart which respectively define a source and a drain. A region of chromium is also provided on a portion of the n-type layer that is between the ohmic contacts and thereby between the source and the drain so as to provide a Schottky metal contact for forming an active channel in the n-type layer between the source and the drain when a bias is applied to the Schottky metal contact.

In further embodiments of the present invention, an overlayer is formed on the ohmic contacts and the Schottky metal contact. Preferably, the ohmic contacts are formed of nickel and the overlayer includes layers of titanium, platinum and gold.

Furthermore, the layers of the transistors according to the present invention may form a mesa having sidewalls extending downward from the n-type layer into the p-type layer which define the periphery of the transistors. Optionally, the sidewalls of the mesa may extend downward into the substrate. A passivation layer may also be provided on the sidewalls of the mesa and exposed portions of the n-type epitaxial layer. Preferably, the passivation layer is an ONO passivation layer.

In still further embodiments of the present invention, the Schottky metal contact is recessed in the active channel portion of the n-type epitaxial layer. The Schottky metal contact may also be a mushroom gate contact. The Schottky metal contact may also include an overlayer having layers of platinum and gold.

Metallization may also be formed on the substrate opposite the n-type layer. Preferably, the metallization includes layers of titanium, platinum and gold coated with an overlayer of eutectic alloy of AuGe.

The substrate may also be semi-insulating silicon carbide. While in particular embodiments it is preferred to utilize a semi-insulating substrate which is substantially free of deep level dopants, in other embodiments a semi-insulating silicon carbide substrate may be silicon carbide with a deep level dopant incorporated therein. The deep level dopant may be vanadium. Preferably, the semi-insulating substrate has a resistance of greater than about 10,000 Ω-cm.

In still further embodiments of the present invention, the ohmic contacts may be formed on regions of n+ silicon carbide which may be formed in the n-type epitaxial layer by ion implantation or, alternatively, formed directly on the n-type epitaxial layer.

Aspects of the present invention also may provide methods of fabricating a metal-semiconductor field-effect transistor by forming a p-type epitaxial layer of selectively doped p-type conductivity silicon carbide on a single crystal silicon carbide substrate, wherein the p-type conductivity silicon carbide has a carrier concentration of from about $1 \times 10^{16}$ to about $1 \times 10^{17}$ cm$^{-3}$, the forming an n-type epitaxial layer of n-type conductivity silicon carbide on the p-type epitaxial layer, then forming ohmic contacts on the n-type epitaxial layer that respectively define a source and a drain and forming a Schottky metal contact on the n-type epitaxial layer that is between the ohmic contacts and thereby between the source and the drain. The n-type epitaxial layer and the p-type epitaxial layer may be etched to form a mesa. Furthermore in a preferred embodiment, the formation of ohmic contacts and a Schottky gate contact are preceded by etching the n-type epitaxial layer and the p-type epitaxial layer to form a mesa and forming an ONO passivation layer on the exposed surfaces of the mesa.

In particular embodiments of the present invention, the ONO passivation layer is formed by high temperature annealing exposed portions of the substrate, p-type epitaxial layer and n-type epitaxial layer in an $H_2$ ambient and then forming an $SiO_2$ layer on the exposed portions of the substrate, p-type epitaxial layer and n-type epitaxial layer. The $SiO_2$ layer is then argon annealed and oxidized. A layer of $Si_3N_4$ is then deposited on the oxidized $SiO_2$ layer and oxidized to provide the ONO structure.

In particular embodiments of the present invention, the high temperature anneal is carried out at a temperature of greater than about 900° C. for a time of from about 15 minutes to about 2 hours. Furthermore, the argon anneal may be carried out at a temperature of about 1200° C. for a time of about 1 hour.

The $SiO_2$ layer may also be formed to a thickness of from about 50 to about 500 Å. Preferably, the $SiO_2$ layer is formed through a dry oxide process at a temperature of about 1200° C. Also, the $SiO_2$ layer is preferably oxidized in a wet environment at a temperature of about 950° C. for a time of about 180 minutes.

The layer of $Si_3N_4$ may be deposited to a thickness of from about 200 to about 2000 Å. Preferably, the layer of $Si_3N_4$ is deposited through chemical vapor deposition such as PECVD or LPCVD. The $Si_3N_4$ layer is also preferably oxidized in a wet environment at a temperature of about 950° C. for a time of about 180 minutes. The $Si_3N_4$ layer may be oxidized to provide an oxide layer having a thickness of from about 20 to about 200 Å.

In other embodiments of the present invention, a gate recess is formed in the n-type epitaxial layer and the Schottky gate contact formed in the gate recess. Preferably, the gate recess is formed by etching through the ONO passivation layer and into the n-type epitaxial layer so as to provide a gate recess in the n-type epitaxial layer and the Schottky gate contact formed in the gate recess utilizing the ONO passivation layer as a mask. Furthermore, the step of etching through the ONO passivation layer may be followed by patterning the ONO passivation layer so as to provide a ledge in sidewalls of the opening of the ONO passivation layer for the gate recess. A mushroom gate structure may then be formed in the gate recess and on the sidewalls and ledge of the ONO passivation layer. The etching of the ONO passivation layer may be carried out by Electron Cyclotron Resonance or Inductively Coupled Plasma etching.

In a still further embodiment of the present invention, $n^+$ well regions are implanted in the n-type epitaxial layer so as to provide source and drain regions and the ohmic contacts formed on the $n^+$ well regions.

In a still further aspect of the present invention, the substrate is thinned and a metallization layer formed on the substrate opposite the p-type epitaxial layer. The metallization layer may be formed by forming a titanium layer on the substrate opposite the p-type epitaxial layer, then forming a layer of platinum on the titanium layer; and then forming a layer of gold on the layer of platinum. A layer of a eutectic alloy of AuGe may also be formed on the layer of gold.

In another aspect of the present invention methods of fabricating a gate structure for a silicon carbide field effect transistor is provided by forming an ONO passivation layer on exposed surfaces of a mesa terminated silicon carbide field effect transistor, forming a gate window in the ONO passivation layer, forming a gate recess in a channel layer of the mesa terminated silicon carbide transistor and forming a gate contact in the gate recess in the channel layer. The ONO passivation layer is preferably formed as described above. Furthermore, the mushroom gate structure may also be formed as described above.

In still further embodiments of the present invention, methods of fabricating a passivation layer of a silicon carbide semiconductor device are provided by forming an oxide layer on the silicon carbide semiconductor device and then annealing the oxide layer in a NO environment. The oxide layer may be thermally grown or deposited. Furthermore, the anneal in the NO environment may be followed by depositing a layer of $Si_3N_4$ on the oxidized $SiO_2$ layer and then oxidizing the layer of $Si_3N_4$.

In particular embodiments, the oxide layer may be formed by high temperature annealing exposed portions of the substrate, p-type epitaxial layer and n-type epitaxial layer in an $H_2$ ambient and then forming an $SiO_2$ layer on the exposed portions of the substrate, p-type epitaxial layer and n-type epitaxial layer, argon annealing the $SiO_2$ layer and oxidizing the $SiO_2$ layer.

In still further embodiments of the present invention, a double recessed gate MESFET may be fabricated by forming an n-type epitaxial layer of n-type conductivity silicon carbide on a silicon carbide substrate, forming ohmic contacts on the n-type epitaxial layer that respectively define a source and a drain, forming a cap layer of n-type silicon carbide on the n-type epitaxial layer, forming a first recess in the cap layer, forming a second recess in the n-type epitaxial layer, wherein the recess in the n-type epitaxial layer is within the first recess in the cap layer, and forming a Schottky metal contact on the n-type epitaxial layer that is between the ohmic contacts and thereby between the source and the drain to form an active channel in the n-type epitaxial layer between the source and the drain when a bias is applied to the Schottky metal contact wherein the Schottky metal contact is within the recess in the n-type epitaxial layer.

In particular embodiments, the formation of an n-type epitaxial layer and a cap layer are provided by epitaxially growing the n-type epitaxial layer and the cap layer in a single growth step. Furthermore, in still further embodiments, an n-type dopant concentration in the single growth step may be changed to grow the cap layer.

In yet additional embodiments of the present invention, the first recess in the cap layer may be formed by patterning the cap layer to form the first recess. Furthermore, a mesa having sidewalls which extend through the cap layer and the n-type epitaxial layer may also be formed. In such embodiments, the patterning of the cap layer to form the first recess may be followed by forming an ONO passivation layer on exposed surfaces of the mesa and the first recess, forming a gate window in the ONO passivation layer, wherein the gate window is within the first recess, forming the second recess in n-type epitaxial layer and forming a gate contact in the second recess.

In still further embodiments, the substrate may be formed by forming a semi-insulating SiC substrate which is substantially free of deep-level dopants. Also, a buffer layer may be formed between the substrate and the n-type epitaxial layer. The buffer layer may be undoped SiC, n-type SiC or p-type SiC. If the buffer layer is p-type SiC, in particular embodiments, the p-type epitaxial layer may be formed by forming a first p-type epitaxial layer on the substrate and forming a second p-type epitaxial layer on the first p-type epitaxial layer, wherein the second p-type epitaxial layer has a lower dopant concentration than the first p-type epitaxial layer.

In still further embodiments, an ohmic contact is formed to the p-type epitaxial layer. Furthermore, p-type dopants may be implanted in the p-type epitaxial layer so as to provide a region of p-type conductivity silicon carbide having a higher carrier concentration than the p-type epitaxial layer the ohmic contact formed on the implanted region. The ohmic contact may be formed by etching a ground contact window through the cap layer and the n-type epitaxial layer in a region adjacent a source region of the MESFET and forming the ohmic contact in the ground contact window.

The advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

The present invention will now be described with reference to the Figures which illustrate various embodiment of the present invention. As illustrated in the Figures, the sizes of layers or regions are exaggerated for illustrative purposes and, thus, are provided to illustrate the general structures or the present invention. Furthermore, various aspects of the present invention are described with reference to a layer being formed on a substrate or other layer. As will be appreciated by those of skill in the art, references to a layer being formed on another layer or substrate contemplates that additional layers may intervene. References to a layer being formed on another layer or substrate without an intervening layer are described herein as being for "directly" on the layer or substrate. Like numbers refer to like elements throughout.

Figure 1:
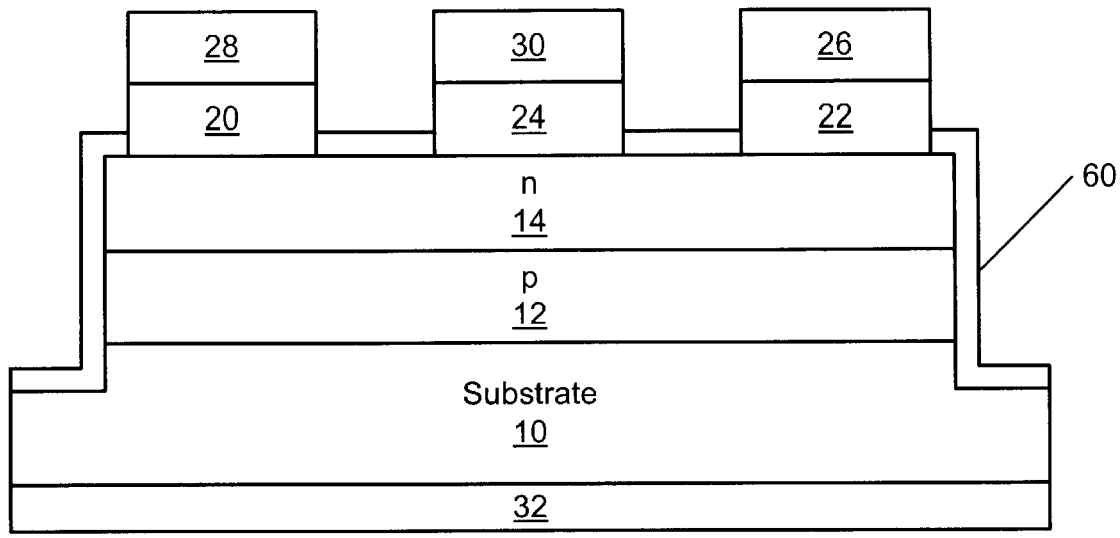
FIG. 1 is a cross-sectional view of one embodiment of the present invention having source and drain regions formed directly on the drift layer.

FIG. 1 illustrates a first embodiment of a MESFET of the present invention. A first epitaxial layer 12 of p-type conductivity is grown on a single crystal bulk silicon carbide substrate 10 of either p-type or n-type conductivity or semi-insulating. The first epitaxial layer of silicon carbide 12 is disposed between the substrate 10 and an n-type epitaxial layer 14. An optional metallization layer, 32 may be formed on the opposite side of the substrate from the first epitaxial layer 12. The metallization layer 32 is preferably formed as described below with reference to FIG. 5.

The first epitaxial layer 12 may be a p-type conductivity silicon carbide epitaxial layer, an undoped silicon carbide epitaxial layer or a very low doped n-type conductivity silicon carbide epitaxial layer. If a low dope silicon carbide epitaxial layer is utilized, then it is preferred that the doping concentration of the first epitaxial layer 12 be less than about $5 \times 10^{15}$ cm$^{-3}$. If an undoped or n-type first epitaxial layer 12 is utilized, the substrate 10 is preferably a semi-insulating silicon carbide substrate. If an undoped or n-type first epitaxial layer 12 is utilized, a high quality channel layer may be formed without the buffer layer having any significant electrical effect on the transistor.

Ohmic contacts 20 and 22, are formed directly on the second epitaxial layer 14 and are spaced apart so as to provide a source contact 20 and a drain contact 22. A Schottky gate contact 24 is formed directly on the second epitaxial layer 14 between the source contact 20 and the drain contact 22. As illustrated, optional metal overlayers 26, 28 and 30 are formed on the source and drain contacts 20 and 22 and the Schottky gate contact 24. In forming the ohmic contacts 20 and 22 directly on the second epitaxial layer 14, it is preferred that these ohmic contacts 20 and 22 be formed of nickel and be annealed at about 1050° C. for about 2 minutes. However, temperatures of from about 800 to about 1150° C. and times of from about 30 seconds to about 10 minutes may also be utilized. It has been found that Ni contacts formed directly on the n-type epitaxial layer 14 may provide a contact resistance below $1 \times 10^{-6}$ Ω-cm$^2$. Such a low resistance may result from the use of the high temperature anneal. By forming the contacts 20 and 22 directly on the epitaxial layer 14 the need for an implantation step may be avoided. Furthermore, the surface roughness which may result from implantation and activation of ions to form the n$^+$ regions of conventional SiC MESFETs may be reduced. As used herein, "n$^+$" or "p$^+$" refer to regions that are defined by higher carrier concentration than are present in adjacent or other regions of the same or another epitaxial layer or substrate.

Figure 2:
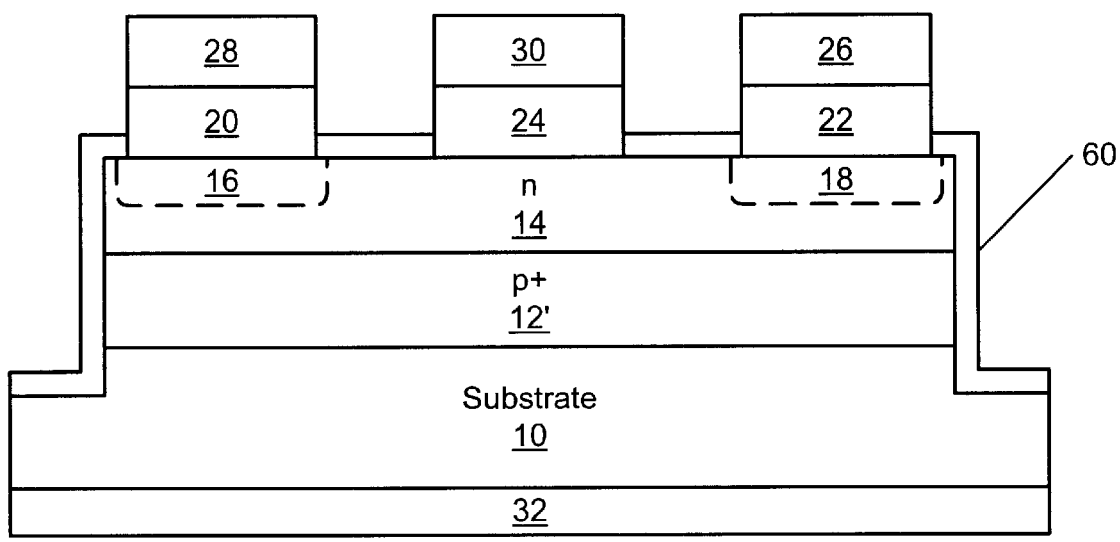
FIG. 2 is a cross-sectional view of a second embodiment of the present invention having a selectively doped isolation layer and n$^+$ regions formed in the n-type type epitaxial layer.

The structure of the transistor as shown in FIG. 1 and subsequent FIGS. 2 and 3, preferably forms a mesa which defines the periphery of the device. In a device not having a p-type epitaxial layer, the substrate and the n-type epitaxial layer form a mesa having sidewalls which define the periphery of the transistor. The sidewalls of the mesa extend downward past the n-type conductivity layer of the device. Preferably, the mesa is formed to extend into the substrate of the device. The mesa preferably extends past the depletion region of the device to confine current flow in the device to the mesa and reduce the capacitance of the device. If the depletion region of the device extends below the level of the mesa then it may spread to areas outside the mesa, resulting in larger capacitance. The mesa is preferably formed by reactive ion etching the above described device, however other methods known to one skilled in the art may be used to form the mesa. Furthermore, if a mesa is not utilized the device may be isolated using other methods such as proton bombardment, counterdoping with compensating atoms or others known to one skilled in the art.

FIG. 2 illustrates a second embodiment of a MESFET according to the present invention. As seen in FIG. 2, a selectively doped p-type epitaxial layer 12' is formed on the substrate 10. The second n-type epitaxial layer 14 is formed on the selectively doped first p-type epitaxial layer 12' and the source and drain contacts 20, 22 and Schottky metal contact 24 are formed on the n-type epitaxial layer 14. Also illustrated in FIG. 2 are optional n$^+$ regions 16 and 18 formed in the source and drain regions of the device. If the n$^+$ regions 16 and 18 are formed, it is preferred that these regions be formed by ion implantation of preferably phosphorous (P), although nitrogen (N) may also be used, followed by a high temperature anneal. Suitable anneal temperatures may be from about 1100 to about 1600° C.

Alternatively, the n$^+$ regions 16 and 18 may be eliminated as described above so as to provide a device having the source, drain and gate structure illustrated in FIG. 1. In such a case, it is preferred that the ohmic contacts 20 and 22 be formed as described above with reference to FIG. 1. As illustrated, optional metal overlayers 26, 28 and 30 are formed on the source and drain contacts 20 and 22 and the Schottky gate contact 24. Also illustrated is a metallization layer 32 formed on substrate 10. The metallization layer 32 is preferably formed as described below with reference to FIG. 5.

Figure 3A:
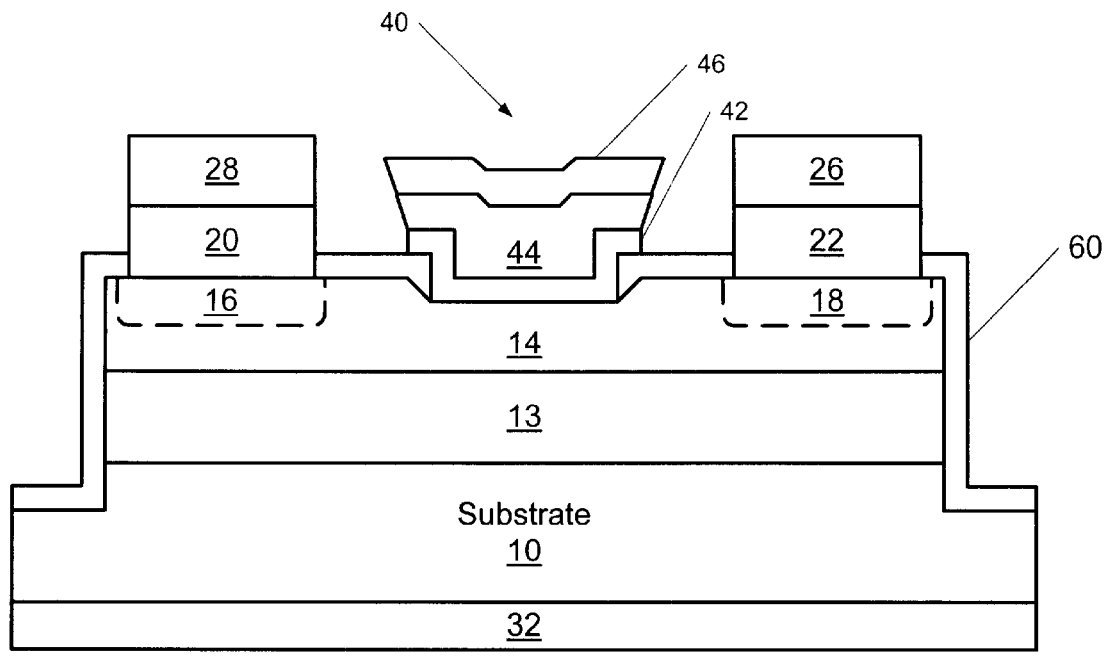
FIG. 3A is a cross-sectional view of a third embodiment of the present invention having a mushroom gate structure.

FIG. 3A illustrates a third embodiment of a MESFET of the present invention where the Schottky gate contact 40 is recessed in the active channel layer. FIG. 3A also illustrates an embodiment of the present invention where the Schottky gate contact 40 is a mushroom gate contact. A first epitaxial layer 13 of p-type conductivity is grown on a single crystal bulk silicon carbide substrate 10 of either p-type conductivity, n-type conductivity or semi-insulating. The p-type epitaxial layer 13 may be a lightly doped p-type layer 12 as illustrated in FIG. 1 or a selectively doped p$^+$ layer 12' as illustrated in FIG. 2. A second epitaxial layer 14 of n-type conductivity is grown on the first epitaxial layer 13. Also illustrated in FIG. 3A are optional n$^+$ regions 16 and 18 formed in the source and drain regions of the device which may be formed as described with reference to FIG. 2. The n$^+$ regions 16 and 18 may be eliminated as described above with reference to FIG. 2 and illustrated in FIG. 1. Ohmic contacts 20 and 22, are formed on wells 16 and 18 to create a source contact and a drain contact. A portion of the second epitaxial layer 14 is removed to provide a recessed section between the source and the drain. A Schottky gate contact 40 is formed in the recessed portion of the second epitaxial layer 14 between the source and drain contacts.

The Schottky gate contact 40 is a mushroom structure. As used herein a mushroom gate is a gate structure at least a portion of which has increasing cross-sectional area as the distance from the second epitaxial layer 14 increases. Preferably, the gate structure is self aligned with respect to the recess in the n-type layer 14. Furthermore, it is preferred that the recess be formed by dry etching and more particularly formed by Electron Cyclotron Resonance (ECR) or Inductively Coupled Plasma (ICP) etching. Forming a self-aligned recess for formation of the gate in such a manner may result in low damage to the epitaxial layer and any insulating layer as well as provide high breakdown characteristics.

Figure 3B:
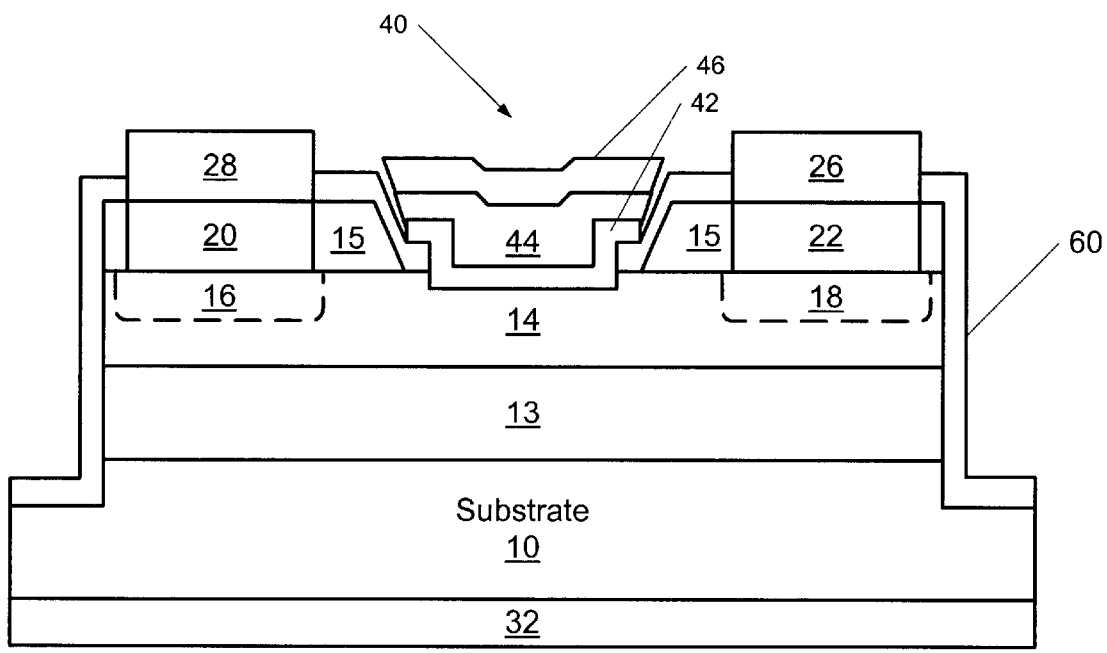
FIG. 3B is cross-sectional view of a fourth embodiment of the present invention having a double recessed gate structure.

Another method of forming the recessed gate is to perform the etching in two steps with a double recess process as illustrated in FIG. 3B. As seen in FIG. 3B, the Schottky gate contact 40 is formed in a double recess through a cap layer 15 and into the second epitaxial layer 14. The cap layer 15 may be first etched through and then a second etch performed to etch into the second epitaxial layer 14. The first etch can be performed either through the cap layer 15 that is doped at the same level as in the ntype epitaxial layer 14 or it can be very lightly n-type doped, with the preferred doping range for the cap layer 15 being $N_D$=about $1\times10^{15}$ cm$^{-3}$ to about $5\times10^{17}$ cm$^{-3}$ and the preferred thickness of this cap layer being from about 50 nm to about 300 nm. The depth of the first etch can be all the way through the cap layer 15, or it may be only partially through the cap layer 15. The preferred depth into the second epitaxial layer 14 for the second etch is from about 20 nm to about 120 nm. The cap layer 15 may be formed as part of the epitaxial growth process of the second epitaxial layer 14, however, the doping concentration may be changed to provide the preferred doping range for the cap layer 15. Thus, the cap layer 15 may be a separate layer or may be part of the second epitaxial layer 14.

The two etch approach may have a number of advantages over a single recess process. One advantage is that the first etch can be performed prior to any metalization on the wafer, allowing a thermal oxide to be grown subsequent to etching. The thermal oxidation process removes SiC that may have been damaged by the etch process and also smoothes out roughness that may have been created on the surface by the etch. This may enable the second etch, performed immediately prior to the gate metalization, to be much shallower, minimizing the sub-surface damage and surface roughness that, typically, cannot be removed. Another advantage of the double recess process is that the shallower second etch reduces the amount of gate contact to the etched side wall. This minimizes the contact area with potentially damaged material and the reduced contact area may also reduce the gate capacitance and, therefore, improve the frequency response of the transistor.

As illustrated, the Schottky mushroom gate contact 40 can optionally be formed of a first gate layer 42 of chromium (Cr) contacting the active channel layer, barrier layer 44 of platinum (Pt) and a third layer of gold 46 or other highly conductive metal. Preferably, the chromium layer 42 is formed by evaporative deposition.

As is further illustrated, an optional metal overlayer 26 and 28 is formed on the source and drain contacts. Preferably, the metal overlayer 26 and 28 is formed of titanium (Ti) for adhesion to a nickel contact, platinum (Pt) as a barrier layer and gold (Au) as a highly conductive metal.

An optional metallization layer 32 may be formed on the opposite side of the substrate 10 from epitaxial layer 13 to provide a conducting plane on the substrate 10. The metallization layer is preferably formed as described below with reference to FIG. 5.

Figure 4:
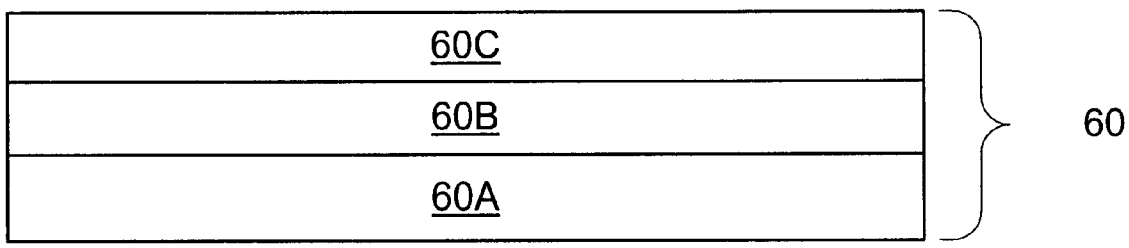
FIG. 4 is a cross-sectional view of a passivation layer structure according to a preferred embodiment of the present invention.

FIG. 4 illustrates a preferred embodiment of the passivation layer 60 of FIGS. 1 through 3. Such a passivation layer may be formed as described in U.S. Pat. No. 5,972,801, the disclosure of which is incorporated herein by reference as if set forth fully herein. Prior to formation of contacts 20, 22, 24 and 40, the upper surface of the device is preferably passivated with an Oxide-Nitride-Oxide (ONO) passivation layer 60. As seen in FIG. 4, the upper surface of the structure is passivated by growing a thermal oxide layer 60A of $SiO_2$, followed by depositing a $Si_3N_4$ layer 60B using PECVD or LPCVD, followed by a final layer of thermally grown $SiO_2$ 60C. Prior to growing the $SiO_2$ layer, the wafer is annealed in a high temperature $H_2$ ambient. Temperatures of greater than about 900° C. for from about 15 minutes to about 2 hours may be utilized for the anneal, however, a temperature of about 1100° C. for about 30 minutes is preferred. The ONO passivation layer enables the device to have better power density, primarily due to decreased trapping from the surface. ONO has lower interface trap density ($D_{it}$) near the conduction band.

Preferably, the passivation layer 60 is formed by first forming an $SiO_2$ layer 60A of about 200 Å through a dry oxide process at about 1200° C. The first layer 60A is then argon annealed for about 1 hour at about 1200° C. This is subsequently oxidized at about 950° C. for about 180 minutes in a wet environment. Then layer 60B of $Si_3N_4$ of about 500 Å thickness is deposited by PECVD or LPCVD. Then a final oxidation is performed at about 950° C. for about 180 minutes in a wet environment to provide the third layer 60C of oxide. While these fabrication specifications are preferred, other suitable conditions and specifications may also be utilized. For example, the first layer 60A may have a thickness of from about 50 to about 500 Å, the second layer 60B may have a thickness of from about 200 to about 2,000 Å and the third layer 60C may have a thickness of from about 20 to about 200 Å. Similarly, the processing conditions may be varied to provide the thickness described above. Through combination of a self-aligned recessed gate and ONO surface passivation, the RF power density may be increased and the amount of drift in the RF performance as the drive level changes may be greatly reduced.

In further embodiments of the present invention, the passivation layer 60 may be a thermally grown or deposited oxide. In either case, the oxide is preferably annealed at from about 1000° C. to about 1300° C. for from about 30 to about 300 minutes in a NO ambient. Such an anneal may reduce interface trap density near the conduction band and, thereby, improve the high frequency performance of the device. In a particularly preferred embodiment of the present invention, the passivation layer 60 is fabricated as described above with reference to FIG. 4 to provide an ONO layer. Preferably, however, the thermal oxide layer 60A is annealed at from about 1000° C. to about 1300° C. for from about 30 to about 300 minutes in a NO ambient prior to depositing the $Si_3N_4$ layer 60B.

Figure 5:
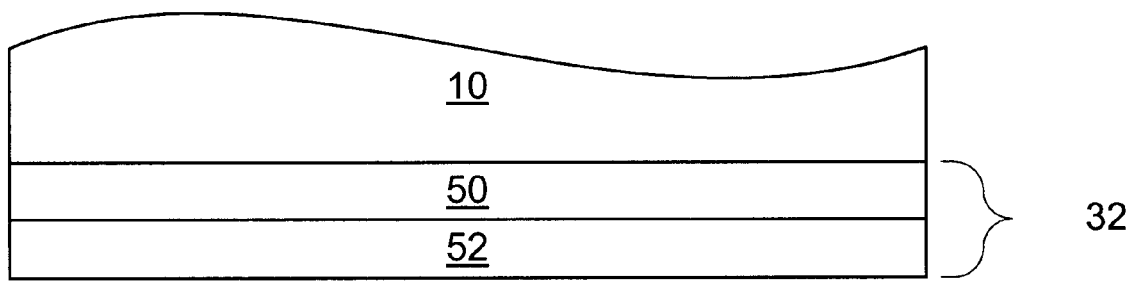
FIG. 5 is a cross-sectional view of a metallization structure according to an embodiment of the present invention.

FIG. 5 illustrates a preferred embodiment for the metallization layer 32 of FIGS. 1 through 3. As seen in FIG. 5, the metallization layer 32 is deposited on the back plane of the substrate 10. Prior to formation of the metallization layer, the wafer is preferably thinned to about 100 μm or less and possibly as low as 50 μm or 25 μm in thickness by a mechanical thinning process such as grinding or lapping. The metallization layer 32 may include a layer 50 of TiPtAu coated with an overlayer 52 of a eutectic alloy of AuGe. The use of such a metallization layer 32 can improve the device packaging by permitting easier attachment of the device to a circuit board. Furthermore, by thinning the wafers before metallization, the thermal performance of the device may be improved.

In each of the embodiments described above, the substrate may be formed of silicon carbide selected from the group of 6H, 4H, 15R or 3C silicon carbide and the epitaxial layers may be formed of silicon carbide selected from the group of 6H, 4H, 15R or 3C silicon carbide. The substrate 10 may be formed of single crystal bulk silicon carbide and may be semi-insulating or either p-type or n-type conductivity. The first epitaxial layers 12, 12' and 13 may be formed of p-type conductivity silicon carbide of 6H, 4H, 15R or 3C polytype. Carrier concentrations of from about $1\times10^{16}$ to about $1\times10^{17}$ $cm^{-3}$ are suitable for the first epitaxial layer if the first epitaxial layer 12' is selectively doped, however, carrier concentrations of about 3 to $5\times10^{16}$ are preferred. Suitable dopants include aluminum, boron and gallium. The first epitaxial layer 12' is preferably selectively doped to provide a total charge density of greater than about $1\times10^{12}$ $cm^{-2}$. Preferably, first epitaxial layer 12' has a thickness of from about 0.5 μm to about 2 μm. As described above, the first epitaxial layer 12 may also be undoped or lightly doped n-type silicon carbide.

The second epitaxial layer 14 may be formed of n-type conductivity silicon carbide of 6H, 4H, 15R or 3C polytype. N-type carrier concentrations of the n-type epitaxial layer from about $2\times10^{16}$ to about $2\times10^{18}$ $cm^{-3}$ are suitable. Suitable dopants include nitrogen and phosphorous, however, nitrogen is preferred. For the optional $n^+$ regions of the transistors described above, carrier concentrations of about $5\times10^{17}$ are suitable but carrier concentrations of about $2\times10^{18}$ or higher are preferred. The ohmic contacts 20 and 22 are preferably formed of nickel or other suitable metals. The Schottky gate contacts 24 may be formed of chromium, platinum or platinum silicide, nickel, or TiWN however other metals such as gold, known to one skilled in the art to achieve the Schottky effect, may be used. Preferably, however, the Schottky gate contact 24 has the three layer structure described with regard to the mushroom gate 40. Such a structure may have advantages because of the high adhesion of chromium (Cr). The above described devices optionally have an overlayer on one or more of the ohmic contacts and the gate contact, the overlayer 26, 28 and 30 as described above but may also be gold, silver, aluminum, platinum and copper. Other suitable highly conductive metals may also be used for the overlayer.

The thickness of the n-type conductivity region beneath the gate contact defines the cross-sectional height of the channel region of the device and is selected based on the desired pinch-off voltage of the device and the carrier concentration. Given the carrier concentration of the second epitaxial layer, the depth of the layer for a given pinch-off voltage may be readily calculated using methods known to one skilled in the art. Accordingly, it is desirable for the thickness and carrier concentration of the n-type epitaxial layer to be selected to provide a pinch-off voltage of greater than −3 volts and preferably greater than −5 volts. The pinch off voltage may also be from between about −3 volts and −20 volts, but preferably between about −5 volts and −15 volts. For a device utilizing an n-type substrate, the thickness of the buried p-type conductivity layer of the above-described devices should be sufficiently thick so that breakdown of the gate junction occurs before the depletion of the p-type conductivity layer. For a device utilizing a p-type substrate, the thickness of the buried p-type conductivity layer and the substrate of the above described devices should be sufficiently thick so that breakdown of the gate junction occurs before the depletion of the p-type conductivity layer and the substrate.

The above descriptions describe the preferred embodiments of the present invention, however, the first epitaxial layer described above may optionally be eliminated and thereby forming a transistor having a single epitaxial layer of n-type conductivity SiC formed on either a semi-insulating substrate or a p-type substrate. In forming a single epitaxial layer device, the substrate of the device it is preferable to utilize either p-type conductivity silicon carbide having the carrier concentrations as described for the p-type buried layer or a semi-insulating substrate.

In selecting the dimensions of the MESFET, the width of the gate is defined as the dimension of the gate perpendicular to the flow of current. As shown in the cross-sections, FIGS. 1 through 3B, the gate width runs into and out of the page. The length of the gate is the dimension of the gate parallel to the flow of current. As seen in the cross-sectional views of FIGS. 1 through 3B, the gate length is the dimension of the gate 24 which is in contact with the second epitaxial layer 14. A third important dimension is the source to gate distance which is shown in the cross-sections, FIGS. 1 through 3, as the distance from the source contact 20 or n+ region 16 if present, to the gate contact 24.

To minimize the effect of low electron mobility, the source to gate distance should be as small as possible without allowing substantial source to gate leakage current. In one embodiment of the present invention, the distance from the source to the Schottky gate contact is large enough to prevent the flow of any substantial leakage current from the source to the gate when a bias is applied to the gate while small enough to minimize the effect of the low electron mobility of silicon carbide. This typically means that the gate contact should be as close to the source contact without coming into contact with the source contact or the n+ region if present. Positioning the gate as close as possible to the source region can maximize the electric field intensity in the region of the transistor where the electrons are accelerated and thereby reduces the effect of low electron mobility of SiC. Typically, the distance from the source to the Schottky contact of about 1 μm or less, is desirable. The gate to drain distance of the device should be large enough to support the gate to drain depletion spread of the device. These distances are typically from about 0.5 μm to about 5 μm.

To further minimize the effect of low electron mobility, the length of the gate contact should be as small as possible. Typically, Schottky gate lengths of less than about 1.0 μm are desirable. By minimizing the length of the gate, the intensity of the electric field beneath the gate is increased. The increase in electric field results because the same voltage is placed across a smaller area. This increase in electric field intensity increases the acceleration of the electrons in the gate area and thereby reduces the effects of the low electron mobility of silicon carbide. Thus, it is desirable to minimize the length of the gate and thereby maximize the intensity of the electric field beneath the gate.

If the first epitaxial layer 12' is selectively doped, then the substrate 10 may also be doped with a deep level dopant such as vanadium to create a semi-insulating substrate. While conventional techniques for forming semi-insulating silicon carbide may be utilized with particular embodiments of the present invention, as is described below, preferably, the semi-insulating substrate is fabricated without deep level dopants.

Figure 6A:
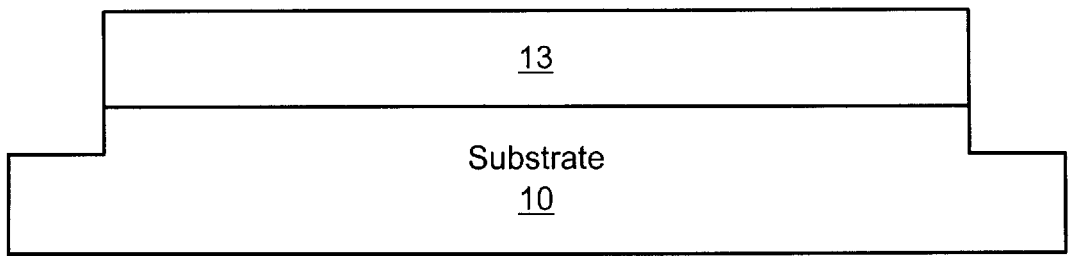
FIGS. 6A through 6I illustrate processing steps in the fabrication of MESFETS according to various embodiments of the present invention.

FIGS. 6A through 6I illustrate processing steps which may be utilized in producing FETs according to various embodiments of the present invention. As seen in FIG. 6A, a p-type epitaxial layer 13 is formed on a SiC substrate 10 as described above. Preferably, the substrate 10 is a semi-insulating SiC substrate and the p-type epitaxial layer 13 is selectively doped to a carrier concentration of from about $1 \times 10^{16}$ to about $1 \times 10^{17}$ cm$^{-3}$ and more preferably from about $3 \times 10^{16}$ to about $5 \times 10^{16}$ cm$^{-3}$.

Preferably, the substrate 10 is semi-insulating with no intentional doping of deep level dopants such that the resistivity of the substrate is not dominated by deep level dopants. Such substrates may be fabricated as described in commonly assigned and co-pending U.S. patent application Ser. No. 09/313,802 entitled "Semi-insulating Silicon Carbide Without Vanadium Domination", the disclosure of which is incorporated herein as if set forth fully. Such a semi-insulating substrate may be produced by providing silicon carbide substrates which sufficiently high levels of point defects and sufficiently matched levels of p-type and n-type dopants such that the resistivity of the silicon carbide substrate is dominated by the point defects. Such a domination may be accomplished by fabricating the silicon carbide substrate at elevated temperatures with source powders which have concentrations of heavy metals, transition elements or other deep level trapping elements of less than about $1 \times 10^{16}$ cm$^{-3}$ and preferably less than about $1 \times 10^{14}$ cm$^{-3}$. For example, temperatures between about 2360° C. and 2380° C. with the seed being about 300° C. to about 500° C. lower may be utilized. Thus, it is preferred that the semi-insulating substrate be substantially free of heavy metal, transition element dopants or other deep level trapping elements, such as vanadium, such that the resistivity of the substrate is not dominated by such heavy metals or transition elements. While it is preferred that the semi-insulating substrate be free of such heavy metal, transition element dopants or deep level trapping elements, such elements may be present in measurable amounts while still benefiting from the teachings of the present invention if the presence of such materials does not substantially affect the electrical properties of the MESFETs described herein. Accordingly, as used herein, the term "substantially free of deep level dopants" refers to concentrations of heavy metals, transition elements or deep level trapping elements which do not substantially affect the electrical properties of a MESFET according to embodiments of the present invention. For example, a substrate with a concentration of heavy metal, transition element of deep level trapping element, such as vanadium, of less than $1 \times 10^{17}$ cm$^{-3}$ may be considered substantially free of deep level dopants.

Figure 6B:
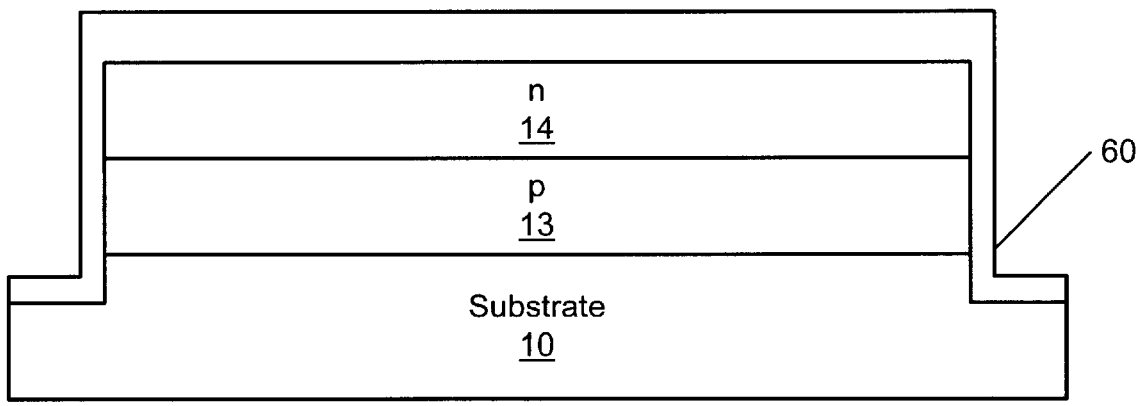

As seen in FIG. 6B, an n-type epitaxial layer 14 is formed on the p-type epitaxial layer 13 as described above with reference to FIGS. 1 through 3. As is also shown in FIG. 6B, the substrate and epitaxial layers are etched to form an isolation mesa and an ONO passivation layer 60 is formed on the mesa, including the n-type epitaxial layer 14. Preferably, the ONO passivation layer 60 is formed as described above with reference to FIG. 4.

As described above, optionally a cap layer 15 may be formed on or as part of the n-type epitaxial layer 14. Thus, in these alternative embodiments, the cap layer 15 may be formed prior to formation of the ONO passivation layer 60. Furthermore, the first etch of the double recess may be performed before formation of the ONO passivation layer 60. The formation of the ONO passivation layer may also be preceded by a thermal oxidation of the SiC cap layer 15 and any exposed portions of the n-type epitaxial layer 14 and a wet etch to remove the oxidation. The process may continue as described below for the single recess embodiments of the present invention.

Figure 6C:
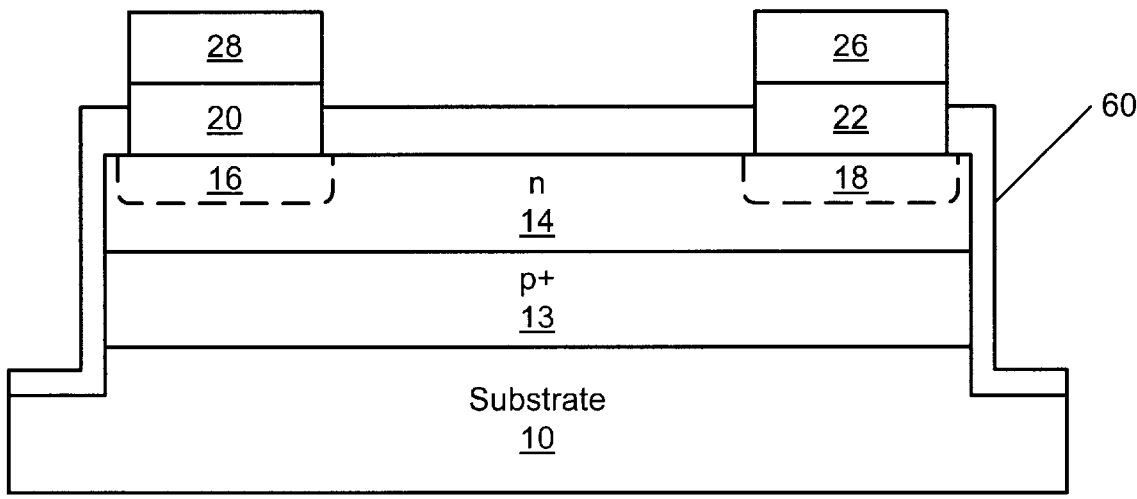

As seen in FIG. 6C, openings may be formed in the ONO layer 60 and n+ wells 16 and 18 implanted in the n-type epitaxial layer 14 and annealed to activate the implant.

Nickel may then be evaporated to deposit the source and drain contacts 20 and 22 and annealed to form the ohmic contacts. Such a deposition and annealing process may be carried out utilizing conventional techniques known to those of skill in the art. FIG. 6C also illustrates the formation of the overlayer 26 and 28 as described above. As will also be appreciated by those of skill it the art, the overlayer may be formed either before or after formation of the Schottky gate structure. In fact, if the titanium/platinum/gold structure described above is utilized the platinum and gold portions of the overlayer may be formed in the same processing steps as the platinum and gold portions of the Schottky gate structure. Accordingly, while the overlayer 26 and 28 is illustrated as being formed prior to the formation of a recess or gate contact, the present invention should not be construed as limited to such a sequence.

Figure 6D:
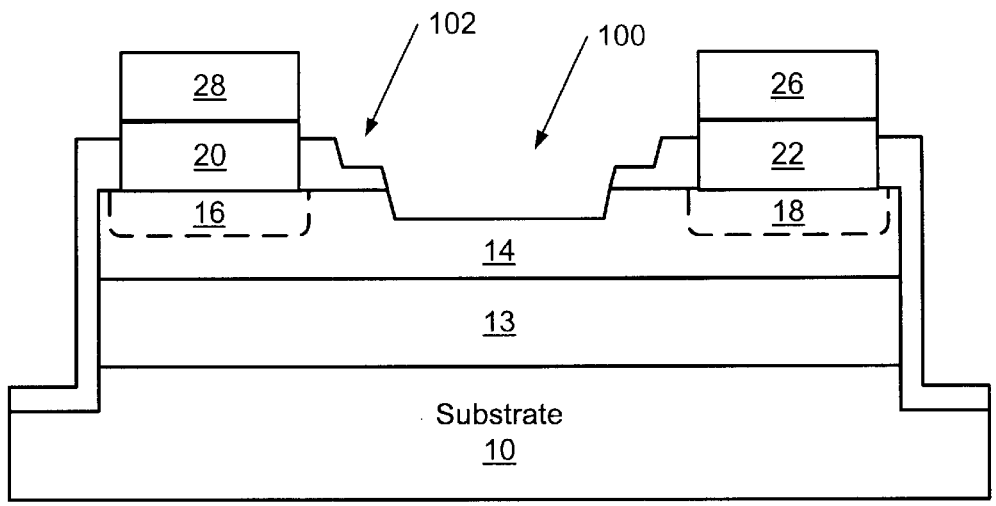
Figure 6E:
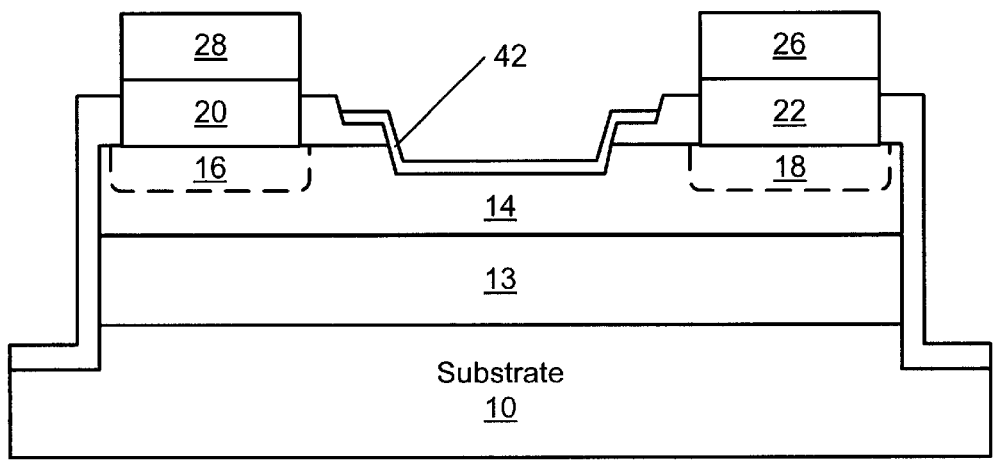
Figure 6F:
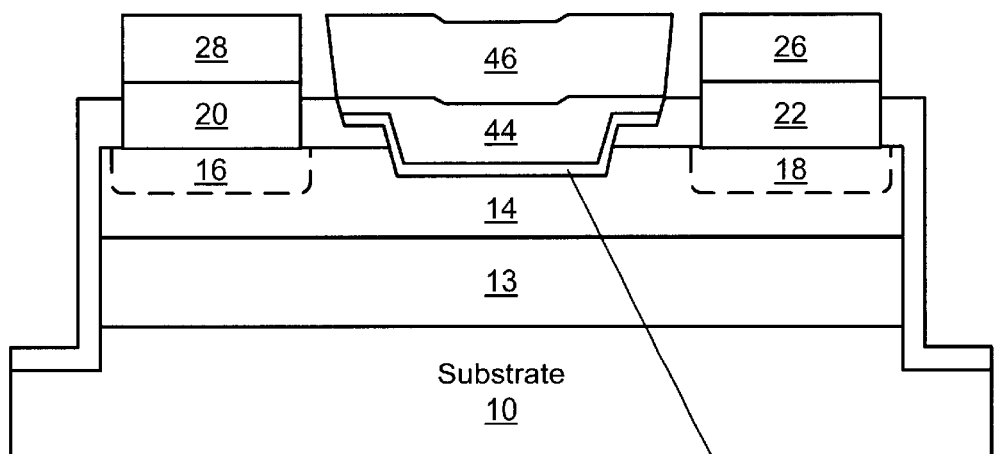

FIG. 6D illustrates the formation of a recess for the gate structure of the MESFET. The ONO layer 60 may be etched through and the n-type epitaxial layer 14 etched into to form the recess 100 for the gate structure. Preferably, the recess 100 is formed by the etching process described above. Subsequently, the ONO layer may be patterned to provide the "T" shaped top of the gate structure by providing the ledge portions 102 of the recess sidewalls. A layer of chromium 42 may then be deposited in the recess as described above and illustrated in FIG. 6E. The gate structure may then be completed by deposition of the platinum layer 44 and the gold layer 46 as illustrated in FIG. 6F.

Figure 6G:
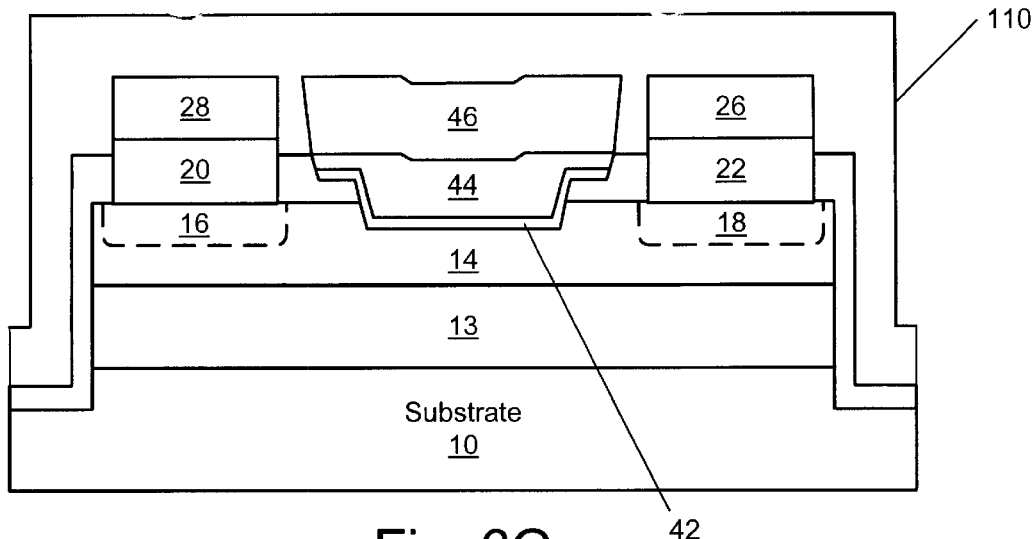
Figure 6H:
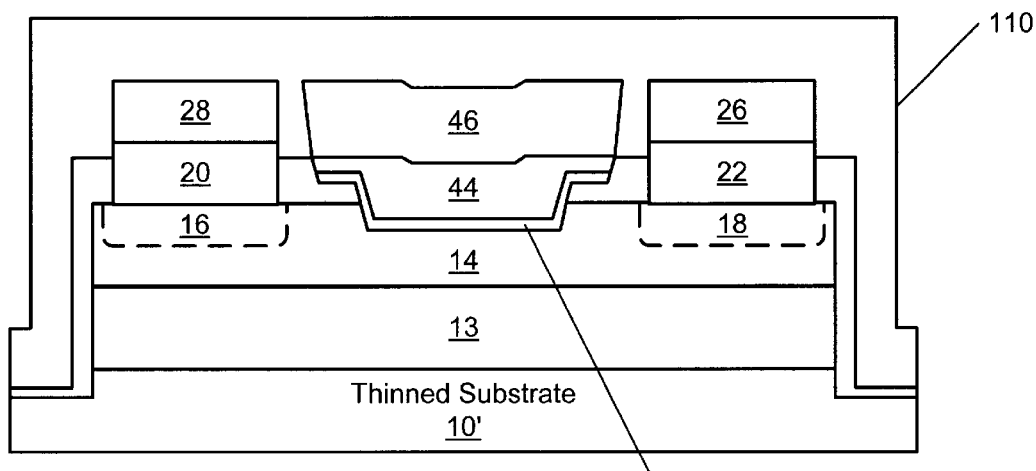
Figure 6I:
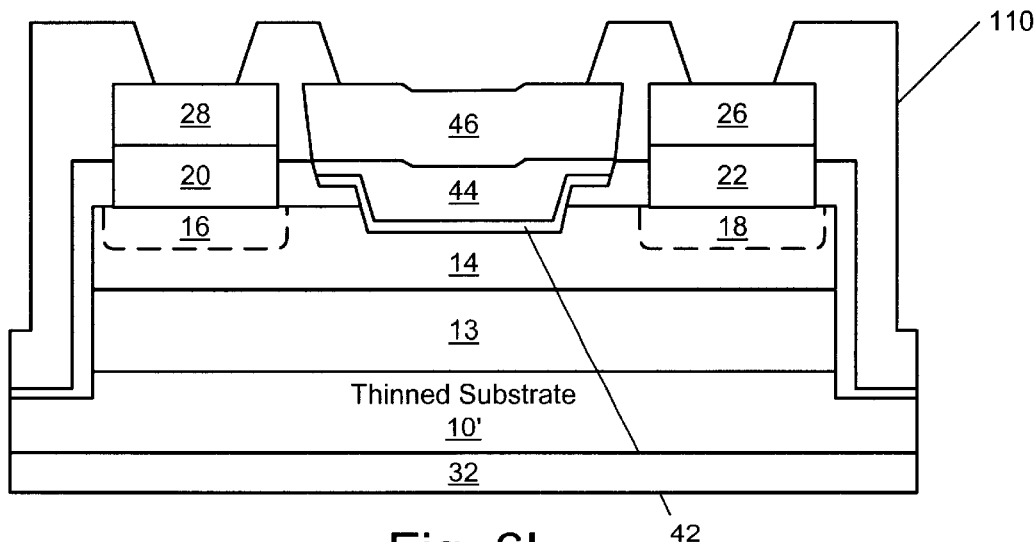

FIG. 6G illustrates the formation of a $Si_3N_4$ layer 110 on the wafer. FIG. 6G also illustrates that the substrate 10 may be thinned as described above to provide a thinned substrate 10'. The metallization 32 may then be formed on the thinned substrate 10' as illustrated in FIG. 6I. Contact holes may also be formed through the $Si_3N_4$ layer 110 so as to allow contact between the source, drain and gate contacts and a metallized interconnect layer (not shown).

The invention and its possible advantages will be further understood through the following example. MESFETs were processed as follows: Epitaxial layers were grown on a semi-insulating 4H-SiC wafer with a p-type buffer layer 0.5 $\mu$m thick doped and an n-type channel layer 0.28 $\mu$m thick and doped. Source and drain $n^+$ wells were formed by ion implantation of phosphorus that was activated with an anneal at 1300° C. for 1 hour. Isolation mesas were then etched, followed by ONO passivation as described above. Ohmic contacts were then formed by etching the ONO off the $n^+$ wells, evaporating Ni and annealing at 1050° C. The 0.7 $\mu$m gates were formed with a self-aligned recess etch through the ONO and 500 Å into the channel. A second photolithography step was used to pattern a T-top, and then the Schottky contact was formed with an evaporation of 250 Å of Cr, 500 Å of Pt and 7500 Å of Au. After gate formation, 1,000 Å of $Si_3N_4$ is deposited by PECVD at 350° C.

Figure 7:
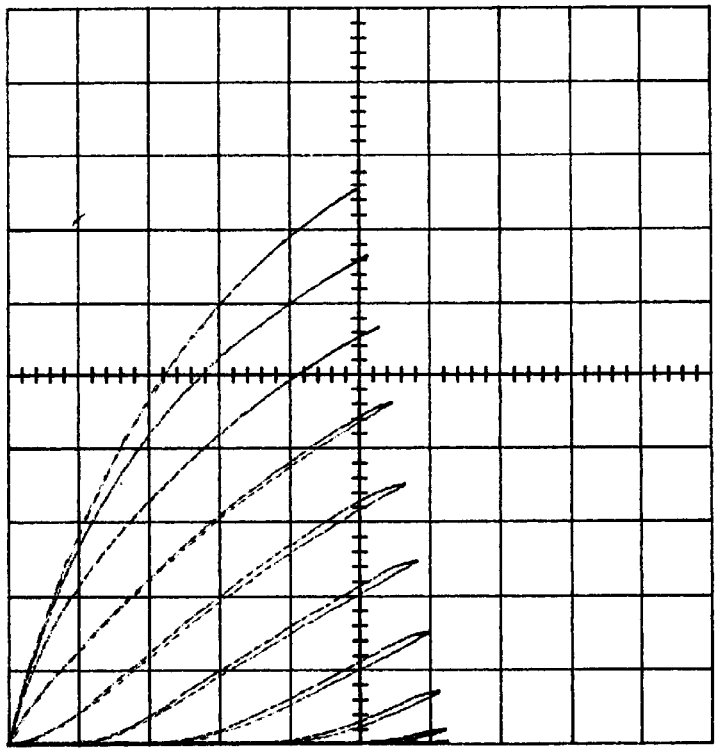
FIG. 7 is a curve tracer plot of the family of DC curves for a 1-mm SiC MESFET having a p-type epitaxial layer doped to an acceptor impurity density $(N_A) < 5 \times 10^{15}$ cm$^{-3}$.
Figure 8:
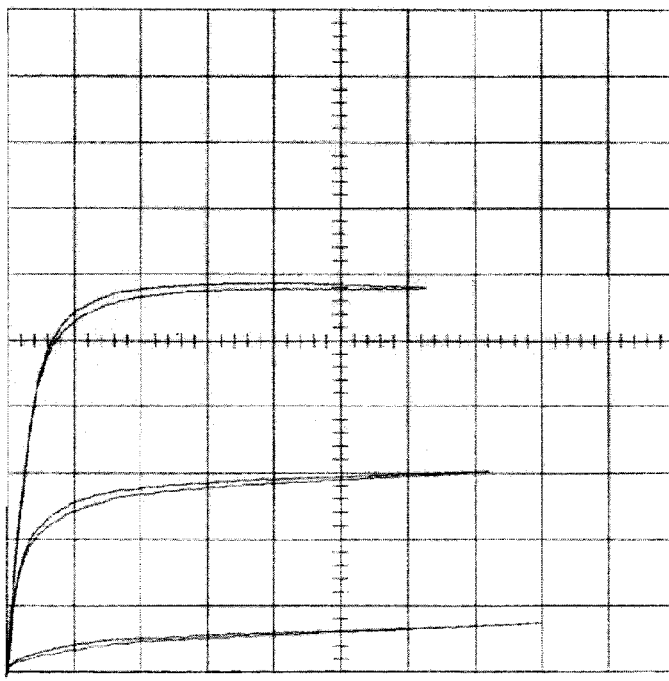
FIG. 8 is a curve tracer plot of the family of DC curves for a 1-mm SiC MESFET having a p-type epitaxial layer doped to $N_A = 9 \times 10^{16}$ cm$^{-3}$.

FIG. 8 is a curve tracer plot of the family of DC curves for a 1-mm SiC MESFET as described above. As can be seen from FIG. 8, the MESFET has reduced output conductance and shows excellent pinch-off out to a drain bias of 200 V. The advantages of the selective doping in the buffer layer are best illustrated by examining the DC I–V characteristics of MESFETs fabricated with a p-type buffer doping of NA $<5\times10^{15}$ cm$^{-3}$ (FIG. 7) and $N_A=9\times10^{16}$ cm$^{-3}$ (FIG. 8). As shown in FIG. 7, with a lightly doped p$^-$ buffer layer design, an extra 6 to 8 V of gate bias is required to keep the channel current pinched off as the drain bias is increased, and the output conductance ($\Delta I_D/\Delta V_D$) is high. By increasing the doping in the buffer to $N_A=9\times10^{16}$ cm$^{-3}$, better current confinement was achieved, as shown in FIG. 8. The output conductance has been reduced by a factor of 3 and the gate voltage required to pinch the device off at $V_{ds}$=200 V is only 2 V more than is required at $V_{ds}$=10 V. Thus, both the gain and efficiency of the MESFET may be improved. MESFETs measured on the wafer with I–V curves shown in FIG. 8 had an increase in power gain of 3 dB at 3.5 GHz as compared to MESFETs measured from the wafer with I–V curves shown in FIG. 7.

Figure 9:
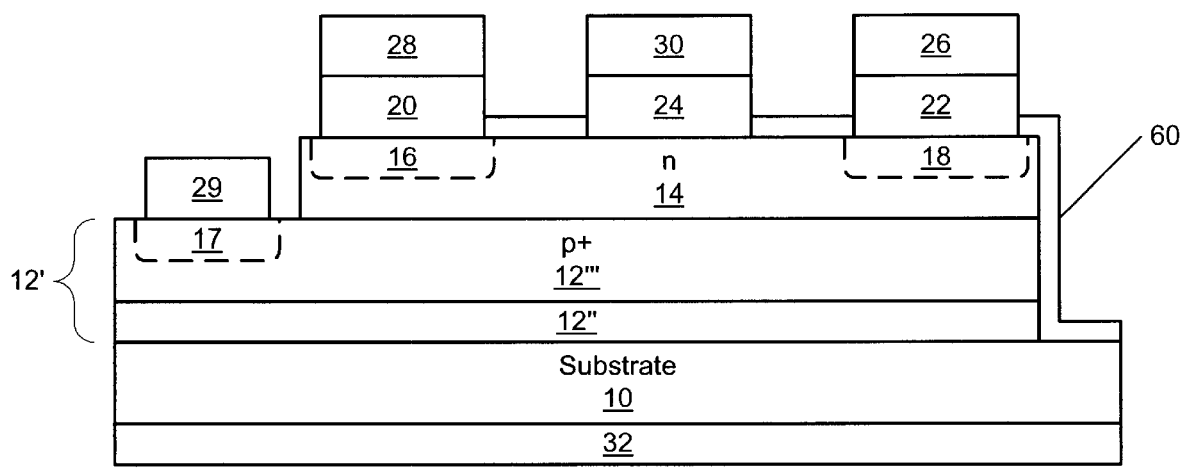
FIG. 9 is a cross-sectional view of one embodiment of the present invention having a ground contact to the buffer layer.

Further improvements to the DC characteristics of the MESFETs according to embodiments of the present invention have been demonstrated by forming a ground contact 29 to the highly doped p-type buffer layer 12' on the source side of the channel as illustrated in FIG. 9. This ground contact 29 may eliminate one of the potential drawbacks of having a p-type buffer layer which is not fully depleted, which is that hole charge can build up and be stored in this layer. This undesired buildup of hole charge may be prevented by providing a ground path for the holes. Because of the difficulty in making high quality ohmic contacts to p-type SiC, it is preferred that the p$^+$ contact wells be formed in the buffer layer by etching off the n-type channel and implanting the buffer layer with a p-type dopant, such as Al, and activating the implanted species at a temperature of between about 1550° C. and about 1750° C. to provide a p$^+$ well 17 in the buffer layer 12'. This p-type contact 29 should be as close to the channel as possible without interfering with the n-type source ohmic contact 20. The p-type ohmic contact 29 may be formed with the same step as the n-type ohmic contacts in order to reduce processing steps. It may also be formed in a separate step using a process designed to minimize ohmic contact resistance to the p-type material. An example of such a process is to deposit Ni with a thickness in the range of from about 500 Å to about 1500 Å and anneal the contacts with a rapid thermal anneal at a temperature in the range of from about 550° C. to about 900° C.

The series resistance of the p-type buffer layer can be reduced by increasing the doping in this layer, but this may have an adverse effect on the frequency response and breakdown voltage of the MESFET. A method of obtaining the advantage of the heavily doped p-type layer without compromising the performance of the MESFET is to form the p-type buffer layer 12' with two layers as illustrated in FIG. 9. The bottom layer 12" may be doped with $N_A$ greater than about $5\times10^{18}$ cm$^{-3}$ and be from about 0.5 to about 2.0 $\mu$m thick to provide a region with low resistance, followed by a layer 12''' with NA between about $5\times10^{16}$ cm$^{-3}$ to about $5\times10^{17}$ cm$^{-3}$ with a thickness of from about 0.75 to about 2.0 $\mu$m that reduces the output conductance of the FET and still supports drain voltages in excess of 200 V. The quality of the p-type ohmic contact may be further improved by forming the implanted p$^+$ well 17 in the heavily doped bottom layer 12".

While embodiments of the present invention incorporating a contact to the buried p-type layer 12' have been described with reference to FIG. 9, as will be appreciated by those of skill in the art, the p-type contact may also be provided in any of the other embodiments described herein having a p-type epitaxial layer. Thus, the present invention should not be construed as limited to the embodiments illustrated in FIG. 9.

As is briefly described above, MESFETs according to preferred embodiments of the present invention utilize semi-insulating SiC substrates. One method of forming semi-insulating substrates is to intentionally incorporate a deep level dopant into the lattice in order to pin the Fermi level at a very deep energy level relative to the conduction band. These deep level dopants act as trap centers for any electrons that get injected into the substrate under normal device operation. This trapping may have a substantial impact on the performance of microwave MESFETs because the time constants associated with these traps are much slower than the frequency at which the devices are being operated, so the amount of trapped charge increases over time and alters the behavior of the transistor.

Figure 10:
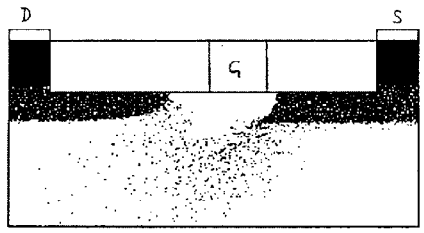
FIG. 10 illustrates the electron distribution in a SiC MESFET as determined with a two-dimensional Monte-Carlo simulation.

FIG. 10 shows the charge distribution in a cross-sectional region of a SiC MESFET that was determined with a two-dimensional Monte-Carlo simulation. The structure that was modeled consisted of a semi-insulating 4H-SiC substrate, a thin p⁻ buffer layer and an n-type channel region 0.25 µm thick with a doping of $N_D=3\times10^{17}$ cm$^{-3}$. The simulations show that under high drain bias voltages there is a significant amount of charge that is pulled into the substrate because of the high electric field between the source and drain regions. This charge can be trapped in the substrate, and as the amount of negative charge beneath the active region of the MESFET increases, the channel becomes depleted from the back side, reducing the amount of current that can flow in the transistor.

Figure 11:
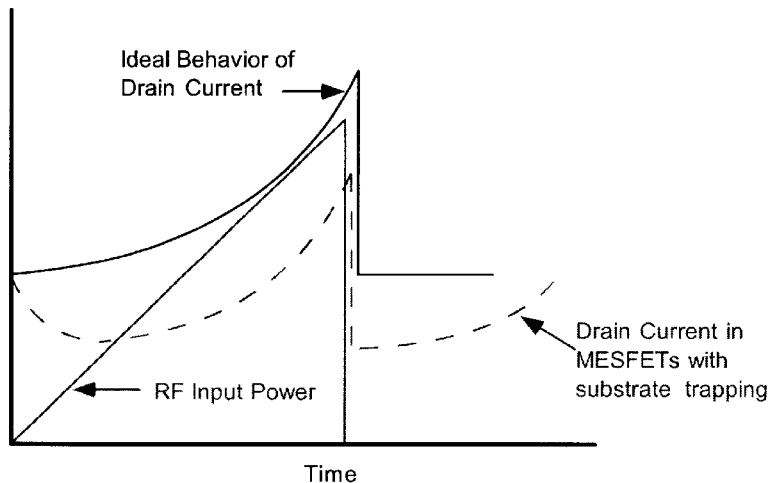
FIG. 11 illustrates drain current as a function of RF drive in a SiC MESFET.

This back-gating effect may impact the operation of MESFETs in several different ways. The first is that the peak RF power available from the device is typically lower than is expected from the DC characteristics of the device because the peak current available under RF drive is reduced by the trapped charge below the channel. Secondly, the efficiency of the part is, typically, not as high as it should be because the ratio of peak to average current is reduced for the same reason. The trapping effects may also change the bias conditions of the part under RF operation as the back-gating charge is accumulated. FIG. 11 illustrates one of these bias shifts that has been observed. In an ideal MESFET, the drain current increases monotonically under RF drive and then returns to the quiescent value when the RF drive is removed. In SiC MESFETs with the presence of deep level traps, the drain current initially droops below the quiescent value as RF drive is increased, thereby reducing the power, linearity and efficiency of the device. An additional problem is that when the RF power is removed, the drain current drops well below the quiescent value and may take several minutes to recover to the original value. Because this is caused by deep level traps, the recovery time can be reduced either by heating the device or by shining light on it.

Figure 12:
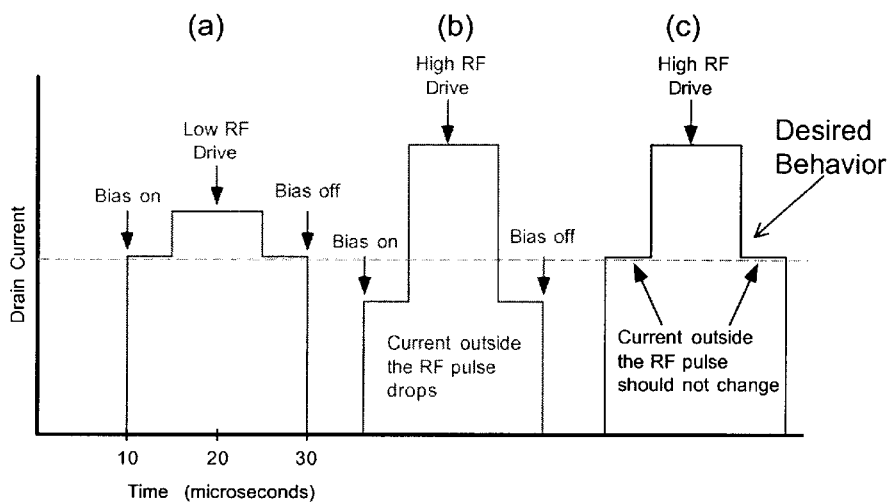
FIG. 12 is an illustration of drain current of a MESFET under pulsed operation where the envelope of the bias voltage is longer than the envelope of the RF signal.

FIG. 12 illustrates another problem with the drain current that has been observed while the MESFETs were being operated in pulsed mode. In pulsed operation, the bias to the device is removed while the RF signal is not present in order to minimize heating and then restored to the device just prior to the beginning of the next RF pulse. In MESFETs fabricated on semi-insulating SiC substrates with high levels of deep level dopants, the current drawn by the device prior to the RF pulse is a function of the amount of RF drive in the preceding pulse. This memory effect implies that charge is being stored somewhere in the device. As seen in FIG. 12, waveform (a) shows the drain current under a low level of RF drive, where the current increases while the RF pulse is on. Waveform (b) shows the same MESFET under high RF drive where the current outside the RF envelope is lower than it was under low RF drive, which is a back-gating effect due to trapped charge. Waveform (c) shows the ideal waveform where the current outside of the applied RF signal is independent of the drive level. Both of these bias shift phenomena can be reduced or eliminated by fabricating MESFETs according to embodiments of the present invention with a recessed gate, either single or double recess, on semi-insulating wafers that have no intentional doping with vanadium, which is the dominant deeplevel dopant commonly used to form semi-insulating SiC.

Figure 13:
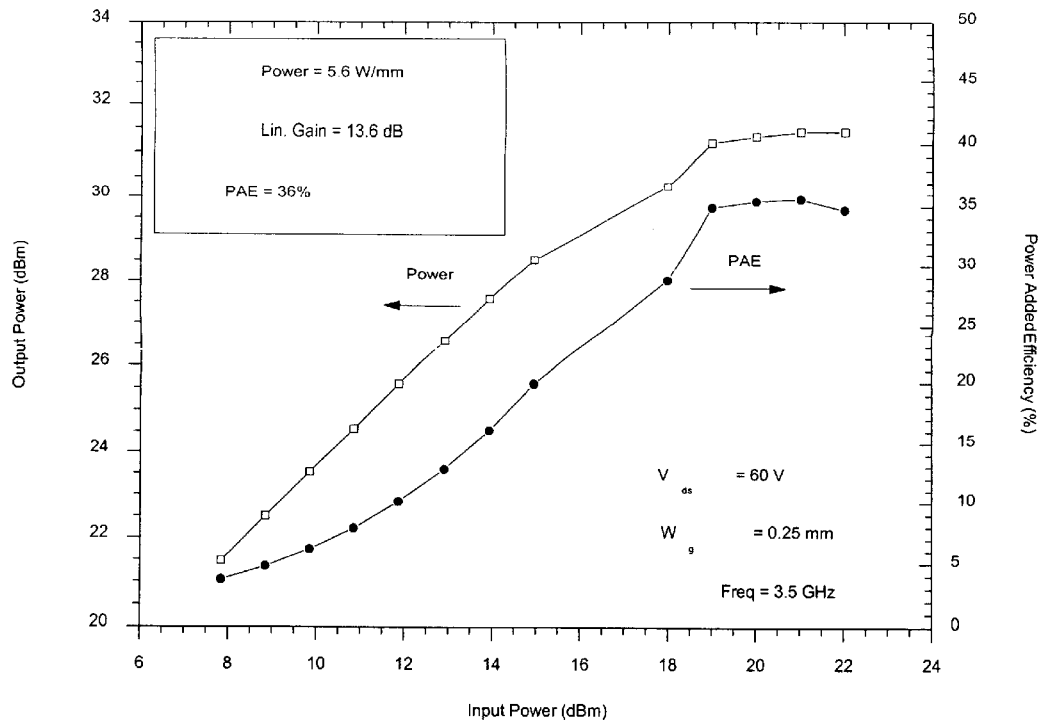
FIG. 13 illustrates on-wafer power measurement of a 0.25-mm SiC MESFET fabricated on a vanadium-doped semi-insulating substrate showing a power density of 5.6 W/mm at 3.5 GHz.
Figure 14:
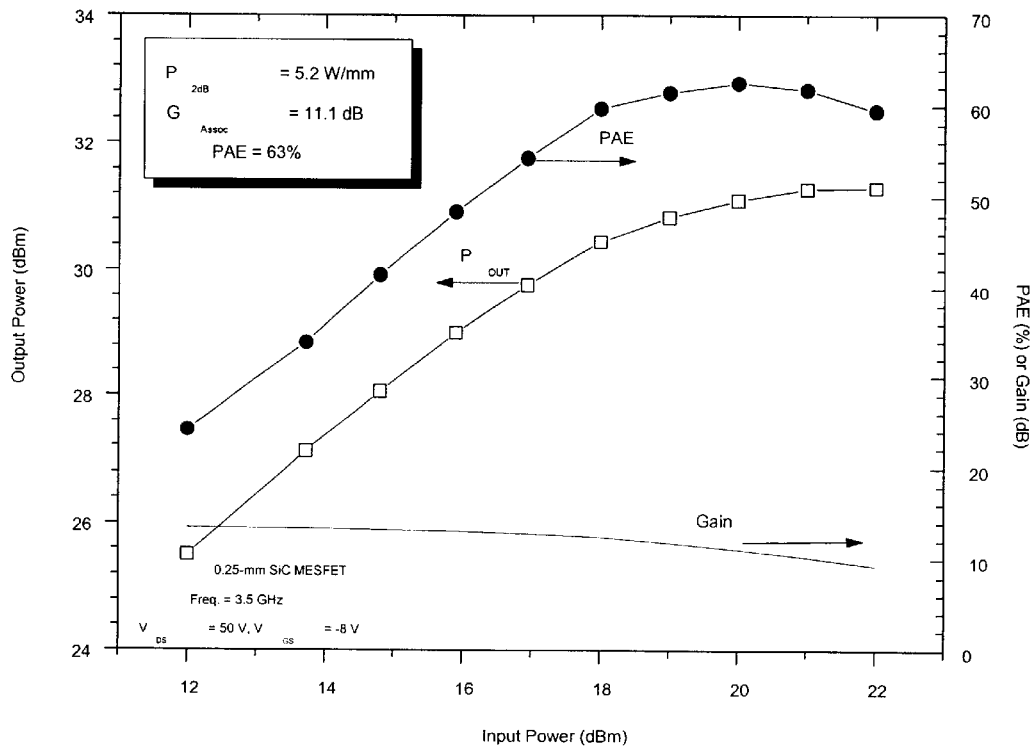
FIG. 14 illustrates on-wafer power measurement of a 0.25-mm SiC MESFET fabricated on a vanadium-free semi-insulating substrate showing a power density of 5.2 W/mm at 3.5 GHz.

Additionally, the efficiency of the devices was improved, as shown by the comparison of on-wafer power measurements in FIG. 13 and FIG. 14. The measurements illustrated in FIG. 13 and FIG. 14 were made at 3.5 GHz on 0.25-mm SiC MESFETs with a gate length of 0.7 µm. The MESFET fabricated on the vanadium-free substrates (FIG. 14) had a much improved power added efficiency of 63% compared to the 35% efficiency of the MESFET fabricated on the vanadium-doped substrates (FIG. 13) while maintaining a comparable power density of >5 W/mm. The improvement in efficiency may result from the ability to bias the transistor at a much lower quiescent drain current and still obtain the same amount of peak power.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A metal-semiconductor field-effect transistor comprising:
    a semi-insulating silicon carbide substrate which is substantially free of deep level dopants;
    an n-type epitaxial layer of n-type conductivity silicon carbide on the substrate,
    ohmic contacts on the n-type epitaxial layer that respectively define a source and a drain;
    a cap layer of n-type silicon carbide on the n-type epitaxial layer;
    a first recess in the cap layer;
    a second recess in the n-type epitaxial layer, wherein the recess in the n-type epitaxial layer is within the first recess in the cap layer; and
    a Schottky metal contact on the n-type epitaxial layer that is between the ohmic contacts and thereby between the source and the drain to form an active channel in the n-type epitaxial layer between the source and the drain when a bias is applied to the Schottky metal contact wherein the Schottky metal contact is within the recess in the n-type epitaxial layer.

2. A metal-semiconductor field-effect transistor according to claim 1, wherein the semi-insulating substrate has a level of deep level dopants which is below a level which dominates the resistivity of the substrate.

3. A metal-semiconductor field-effect transistor according to claim 1, wherein the semi-insulating silicon carbide substrate has less than about $1\times10^{16}$ cm$^{-3}$ of heavy metals, transition elements and deep level trapping elements.

4. A metal-semiconductor field-effect transistor according to claim 1, wherein the semi-insulating silicon carbide substrate has less than about $1\times10^{14}$ cm$^{-3}$ of heavy metals, transition elements and deep level trapping elements.

5. A metal-semiconductor field-effect transistor according to claim 1, wherein the n-type epitaxial layer and the cap layer have carrier concentrations which are substantially the same.

6. A transistor according to claim 1, wherein the recess in the n-type epitaxial layer extends to a depth of from about 20 nm to about 120 nm.

7. A transistor according to claim 1, wherein the cap layer has a dopant level from about $1\times10^{15}$ cm$^{-3}$ to about $5\times10^{17}$ cm$^{-3}$.

8. A transistor according to claim 1, wherein the cap layer has a thickness of from about 50 nm to about 300 nm.

9. A transistor according to claim 1, wherein the ohmic contacts are directly on the n-type epitaxial layer.

10. A transistor according to claim 1, further comprising regions of n⁺ silicon carbide between the n-type epitaxial layer and the ohmic contacts.

11. A transistor according to claim 1, wherein the ohmic contacts comprise nickel contacts directly on the n-type epitaxial layer.

12. A transistor according to claim 1 further comprising an overlayer on the ohmic contacts and the Schottky metal contact.

13. A transistor according to claim 12, wherein the ohmic contacts comprise nickel and wherein the overlayer comprises layers of titanium, platinum and gold.

14. A transistor according to claim 1, wherein the n-type epitaxial forms a mesa having sidewalls extending through the n-type layer which define the periphery of the transistor.

15. A transistor according to claim 14 wherein the sidewalls of the mesa extend into the substrate.

16. A transistor according to claim 14, further comprising a passivation layer on the sidewalls of the mesa and exposed portions of the n-type epitaxial layer.

17. A transistor according to claim 16, wherein the passivation layer is an ONO passivation layer.

18. A transistor according to claim 1 wherein the Schottky metal contact comprises a first gate layer of chromium directly on the n-type epitaxial layer.

19. A transistor according to claim 18, wherein the Schottky metal contact further comprises an overlayer on the first gate layer, wherein the overlayer comprises layers of platinum and gold.

20. A transistor according to claim 19, wherein the Schottky metal contact is a mushroom gate.

21. A transistor according to claim 20, further comprising a recess in the n-type epitaxial layer and wherein the first gate layer is formed in the recess in the n-type epitaxial layer.

22. A transistor according to claim 20, wherein the mushroom gate is self aligned with respect to the recess.

23. A transistor according to claim 1, further comprising an undoped silicon carbide buffer layer formed between the substrate and the n-type epitaxial layer.

24. A transistor according to claim 1, further comprising an n-type conductivity silicon carbide buffer layer formed between the substrate and the n-type epitaxial layer.

25. A transistor according to claim 1, further comprising a p-type silicon carbide buffer layer formed between the substrate and the n-type epitaxial layer.

26. A transistor according to claim 25, further comprising an ohmic contact to the p-type buffer layer.

27. A transistor according to claim 26, further comprising a well region of p⁺ silicon carbide formed in the p-type buffer layer and wherein the ohmic contact is formed on the p⁺ well region.

28. A transistor according to claim 26, wherein the p-type buffer layer comprises:
a first p-type layer; and
a second p-type layer, wherein the first p-type layer has a doping concentration higher than a doping concentration of the second p-type layer.

29. A metal-semiconductor field-effect transistor comprising:
a silicon carbide substrate;
an n-type epitaxial layer of n-type conductivity silicon carbide on the substrate;
ohmic contacts on the n-type epitaxial layer that respectively define a source and a drain;
a Schottky metal contact on the n-type epitaxial layer that is between the ohmic contacts and thereby between the source and the drain to form an active channel in the n-type epitaxial layer between the source and the drain when a bias is applied to the Schottky metal contact;
metallization formed on the substrate opposite the n-type layer; and
wherein the metallization comprises layers of titanium, platinum and gold coated with an overlayer of eutectic alloy of AuGe.

30. A transistor according to claim 29, wherein the substrate has a thickness of about 100 μm or less.

31. A metal-semiconductor field-effect transistor comprising:
a silicon carbide substrate;
an n-type epitaxial layer of n-type conductivity silicon carbide on the substrate;
ohmic contacts on the n-type epitaxial layer that respectively define a source and a drain;
a cap layer of n-type silicon carbide on the n-type epitaxial layer;
a first recess in the cap layer;
a second recess in the n-type epitaxial layer, wherein the recess in the n-type epitaxial layer is within the first recess in the cap layer; and
a Schottky metal contact on the n-type epitaxial layer that is between the ohmic contacts and thereby between the source and the drain to form an active channel in the n-type epitaxial layer between the source and the drain when a bias is applied to the Schottky metal contact wherein the Schottky metal contact is within the recess in the n-type epitaxial layer.

32. A metal-semiconductor field-effect transistor according to claim 31, wherein the n-type epitaxial layer and the cap layer have carrier concentrations which are substantially the same.

33. A transistor according to claim 31, wherein the recess in the n-type epitaxial layer extends to a depth of from about 20 nm to about 120 nm.

34. A transistor according to claim 31, wherein the cap layer has a dopant level from about $1\times10^{15}$ cm$^{-3}$ to about $5\times10^{17}$ cm$^{-3}$.

35. A transistor according to claim 31, wherein the cap layer has a thickness of from about 50 nm to about 300 nm.

36. A transistor according to claim 31, wherein the ohmic contacts are directly on the n-type epitaxial layer.

37. A transistor according to claim 31, further comprising regions of n⁺ silicon carbide between the n-type epitaxial layer and the ohmic contacts.

38. A transistor according to claim 31, wherein the ohmic contacts comprise nickel contacts directly on the n-type epitaxial layer.

39. A transistor according to claim 31 further comprising an overlayer on the ohmic contacts and the Schottky metal contact.

40. A transistor according to claim 39, wherein the ohmic contacts comprise nickel and wherein the overlayer comprises layers of titanium, platinum and gold.

41. A transistor according to claim 31, wherein the n-type epitaxial forms a mesa having sidewalls extending through the n-type layer which define the periphery of the transistor.

42. A transistor according to claim 41 wherein the sidewalls of the mesa extend into the substrate.

43. A transistor according to claim 41, further comprising a passivation layer on the sidewalls of the mesa and exposed portions of the n-type epitaxial layer.

44. A transistor according to claim 43, wherein the passivation layer is an ONO passivation layer.

45. A transistor according to claim 31, further comprising metallization formed on the substrate opposite the n-type layer.

46. A transistor according to claim 45, wherein the substrate has a thickness of about 100 μm or less.

47. A transistor according to claim 45, wherein the metallization comprises layers of titanium, platinum and gold coated with an overlayer of eutectic alloy of AuGe.

48. A transistor according to claim 31 wherein the Schottky metal contact comprises a first gate layer of chromium directly on the n-type epitaxial layer.

49. A transistor according to claim 48, wherein the Schottky metal contact further comprises an overlayer on the first gate layer, wherein the overlayer comprises layers of platinum and gold.

50. A transistor according to claim 49, wherein the Schottky metal contact is a mushroom gate.

51. A transistor according to claim 50, wherein the mushroom gate is self aligned with respect to the second recess.

52. A transistor according to claim 31, further comprising an undoped silicon carbide buffer layer formed between the substrate and the n-type epitaxial layer.

53. A transistor according to claim 31, further comprising an n-type conductivity silicon carbide buffer layer formed between the substrate and the n-type epitaxial layer.

54. A transistor according to claim 31, further comprising a p-type silicon carbide buffer layer formed between the substrate and the n-type epitaxial layer.

55. A transistor according to claim 54, further comprising an ohmic contact to the p-type buffer layer.

56. A transistor according to claim 55, further comprising a well region of p$^+$ silicon carbide formed in the p-type buffer layer and wherein the ohmic contact is formed on the p$^+$ well region.

57. A transistor according to claim 55, wherein the p-type buffer layer comprises:
   a first p-type layer; and
   a second p-type layer, wherein the first p-type layer has a doping concentration higher than a doping concentration of the second p-type layer.

58. A metal-semiconductor field-effect transistor comprising:
   a bulk single crystal semi-insulating silicon carbide substrate;
   an n-type epitaxial layer of n-type conductivity silicon carbide on the substrate;
   a p-type epitaxial layer of selectively doped p-type conductivity silicon carbide between the substrate and the n-type epitaxial layer;
   ohmic contacts on the n-type epitaxial layer that respectively define a source and a drain;
   a Schottky metal contact on the n-type epitaxial layer that is between the ohmic contacts and thereby between the source and the drain to form an active channel in the n-type epitaxial layer between the source and the drain when a bias is applied to the Schottky metal contact; and
   wherein the p-type epitaxial layer comprises:
      a first p-type conductivity silicon carbide layer formed on the substrate; and
      a second p-type conductivity silicon carbide layer formed on the substrate, wherein the first p-type conductivity silicon carbide layer is more heavily doped than the second p-type conductivity silicon carbide layer.

59. A transistor according to claim 58, wherein the ohmic contacts are directly on the n-type epitaxial layer.

60. A transistor according to claim 58, further comprising regions of n$^+$ silicon carbide between the n-type epitaxial layer and the ohmic contacts.

61. A transistor according to claim 58, wherein the ohmic contacts comprise nickel contacts directly on the n-type epitaxial layer.

62. A transistor according to claim 58 further comprising an overlayer on the ohmic contacts and the Schottky metal contact.

63. A transistor according to claim 62, wherein the ohmic contacts comprise nickel and wherein the overlayer comprises layers of titanium, platinum and gold.

64. A transistor according to claim 58, wherein the n-type epitaxial and p-type epitaxial layers form a mesa having sidewalls extending from the n-type layer into the p-type layer which define the periphery of the transistor.

65. A transistor according to claim 64 wherein the sidewalls of the mesa extend into the substrate.

66. A transistor according to claim 64, further comprising a passivation layer on the sidewalls of the mesa and exposed portions of the n-type epitaxial layer.

67. A transistor according to claim 66, wherein the passivation layer is an ONO passivation layer.

68. A transistor according to claim 58, further comprising metallization formed on the substrate opposite the n-type layer.

69. A transistor according to claim 68, wherein the substrate has a thickness of about 100 μm or less.

70. A transistor according to claim 68, wherein the metallization comprises layers of titanium, platinum and gold coated with an overlayer of eutectic alloy of AuGe.

71. A transistor according to claim 58 wherein the Schottky metal contact comprises a first gate layer of chromium directly on the n-type epitaxial layer.

72. A transistor according to claim 71, wherein the Schottky metal contact further comprises an overlayer on the first gate layer, wherein the overlayer comprises layers of platinum and gold.

73. A transistor according to claim 72, wherein the Schottky metal contact is a mushroom gate.

74. A transistor according to claim 73, further comprising a recess in the n-type epitaxial layer and wherein the first gate layer is formed in the recess in the n-type epitaxial layer.

75. A transistor according to claim 73, wherein the mushroom gate is self aligned with respect to the recess.

76. A transistor according to claim 58, further comprising:
   a cap layer of n-type silicon carbide on the n-type epitaxial layer;
   a recess in the cap layer;
   a recess in the n-type epitaxial layer, wherein the recess in the n-type epitaxial layer is within the recess in the cap layer; and
   wherein the Schottky metal contact is within the recess in the n-type epitaxial layer.

77. A transistor according to claim 76, wherein the recess in the n-type epitaxial layer extends to a depth of from about 20 nm to about 120 nm.

78. A transistor according to claim 76, wherein the cap layer is doped at the same level as the n-type epitaxial layer.

79. A transistor according to claim 76, wherein the cap layer has a dopant level from about $1 \times 10^{15}$ cm$^{-3}$ to about $5 \times 10^{17}$ cm$^{-3}$.

80. A transistor according to claim 76, wherein the cap layer has a thickness of from about 50 nm to about 300 nm.

81. A transistor according to claim 58, wherein the semi-insulating silicon carbide is substantially free of deep level dopants.

82. A metal-semiconductor field-effect transistor comprising:
- a bulk single crystal semi-insulating silicon carbide substrate;
- an n-type epitaxial layer of n-type conductivity silicon carbide on the substrate;
- a p-type epitaxial layer of selectively doped p-type conductivity silicon carbide between the substrate and the n-type epitaxial layer;
- ohmic contacts on the n-type epitaxial layer that respectively define a source and a drain;
- a Schottky metal contact on the n-type epitaxial layer that is between the ohmic contacts and thereby between the source and the drain to form an active channel in the n-type epitaxial layer between the source and the drain when a bias is applied to the Schottky metal contact;
- a contact to the p-type epitaxial layer; and
- wherein the p-type epitaxial layer comprises:
  - a first p-type conductivity silicon carbide layer formed on the substrate; and
  - a second p-type conductivity silicon carbide layer formed on the substrate, wherein the first p-type conductivity silicon carbide layer is more heavily doped than the second p-type conductivity silicon carbide layer.

83. A transistor according to claim 82, further comprising:
- a p$^+$ well region formed in the p-type epitaxial layer; and
- wherein the contact to the p-type epitaxial layer is formed on the p$^+$ well region.

84. A metal-semiconductor field-effect transistor comprising:
- an n-type layer of n-type conductivity silicon carbide on a silicon carbide substrate;
- ohmic contacts on the n-type layer and spaced apart that respectively define a source and a drain;
- a region of chromium on the n-type layer that is between the ohmic contacts and thereby between the source and the drain so as to provide a Schottky metal contact to form an active channel in the n-type layer between the source and the drain when a bias is applied to the Schottky metal contact; and
- metallization on the substrate opposite the n-type layer, wherein the metallization comprises layers of titanium, platinum and gold coated with an overlayer of eutectic alloy of AuGe.

85. A transistor according to claim 84, further comprising a p-type layer of p-type conductivity silicon carbide between the substrate and the n-type layer.

86. A transistor according to claim 85, further comprising an ohmic contact to the p-type buffer layer.

87. A transistor according to claim 86, further comprising a well region of p$^+$ silicon carbide formed in the p-type buffer layer and wherein the ohmic contact is formed on the p$^+$ well region.

88. A transistor according to claim 86, wherein the p-type buffer layer comprises:
- a first p-type layer; and
- a second p-type layer, wherein the first p-type layer has a doping concentration higher than a doping concentration of the second p-type layer.

89. A transistor according to claim 85, wherein the n-type and p-type layers forms a mesa having sidewalls extending from the n-type layer into the p-type layer which define the periphery of the transistor.

90. A transistor according to claim 89, wherein the sidewalls of the mesa extend into the substrate.

91. A transistor according to claim 89, further comprising a passivation layer on the sidewalls of the mesa and exposed portions of the n-type epitaxial layer.

92. A transistor according to claim 91, wherein the passivation layer is an ONO passivation layer.

93. A transistor according to claim 87, wherein the Schottky metal contact further comprises an overlayer on the chromium region, wherein the overlay comprises layers of platinum and gold.

94. A transistor according to claim 84, further comprising regions of n$^+$ silicon carbide between the n-type layer and the ohmic contacts.

95. A transistor according to claim 84 further comprising an overlayer on the ohmic contacts and the Schottky metal contact.

96. A transistor according to claim 95, wherein the ohmic contacts comprise nickel and wherein the overlayer comprises layers of titanium, platinum and gold.

97. A transistor according to claim 84, wherein the substrate has a thickness of 100 µm or less.

98. A transistor according to claim 84, wherein the Schottky metal contact is a mushroom gate.

99. A transistor according to claim 84, further comprising a recess in the n-type layer and wherein the chromium region is in the recess in the n-type layer.

100. A transistor according to claim 99, wherein the chromium region is self aligned.

101. A transistor according to claim 84, wherein the ohmic contacts are directly on the n-type layer.

102. A metal-semiconductor field-effect transistor comprising:
- a bulk single crystal semi-insulating silicon carbide substrate;
- an n-type epitaxial layer of n-type conductivity silicon carbide on the substrate;
- ohmic contacts on the n-type epitaxial layer that respectively define a source and a drain;
- a Schottky metal contact on the n-type epitaxial layer that is between the ohmic contacts and thereby between the source and the drain to form an active channel in the n-type epitaxial layer between the source and the drain when a bias is applied to the Schottky metal contact;
- a p-type layer of p-type conductivity silicon carbide between the substrate and the n-type epitaxial layer; and
- an ohmic contact to the p-type layer.

103. A transistor according to claim 102,
- wherein the n-type epitaxial layer forms a mesa having sidewalls extending into the n-type layer which define the periphery of the transistor; and
- wherein the sidewalls of the mesa extends from the n-type layer into the p-type layer.

104. A transistor according to claim 103 wherein the sidewalls of the mesa extend into the substrate.

105. A transistor according to claim 103, wherein the ohmic contact on the p-type layer is directly on the p-type layer.

106. A transistor according to claim 103, further comprising an ONO passivation layer on the sidewalls of the mesa and on exposed portions of the n-type epitaxial layer.

107. A transistor according to claim 102, wherein the ohmic contacts are directly on the n-type epitaxial layer.

108. A transistor according to claim 102, further comprising regions of n$^+$ silicon carbide between the n-type epitaxial layer and the ohmic contacts.

109. A transistor according to claim 102, wherein the ohmic contacts comprise nickel contacts directly on the n-type epitaxial layer.

110. A transistor according to claim 102 further comprising an overlayer on the ohmic contacts and the Schottky metal contact.

111. A transistor according to claim 110, wherein the ohmic contacts comprise nickel and wherein the overlayer comprises layers of titanium, platinum and gold.

112. A transistor according to claim 102, further comprising metallization formed on the substrate opposite the n-type layer.

113. A transistor according to claim 112, wherein the substrate has a thickness of about 100 μm or less.

114. A transistor according to claim 112, wherein the metallization comprises layers of titanium, platinum and gold coated with an overlayer of eutectic alloy of AuGe.

115. A transistor according to claim 102, wherein the Schottky metal contact is a mushroom gate.

116. A transistor according to claim 102, further comprising a recess in the n-type epitaxial layer and wherein the gate contact is formed in the recess in the n-type epitaxial layer.

117. A transistor according to claim 116, wherein the gate contact is a self aligned gate contact.

118. A metal-semiconductor field-effect transistor comprising:
   a bulk single crystal silicon carbide substrate;
   an n-type epitaxial layer of n-type conductivity silicon carbide on the substrate;
   ohmic contacts on the n-type epitaxial layer that respectively define a source and a drain;
   a Schottky metal contact on the n-type epitaxial layer that is between the ohmic contacts and thereby between the source and the drain to form an active channel in the n-type epitaxial layer between the source and the drain when a bias is applied to the Schottky metal contact;
   a p-type layer of p-type conductivity silicon carbide between the substrate and the n-type epitaxial layer;
   an ohmic contact to the p-type layer; and
   a well region of p$^+$ silicon carbide formed in the p-type epitaxial layer and wherein the ohmic contact is formed on the p$^+$ well region.

119. A metal-semiconductor field-effect transistor comprising:
   a bulk single crystal silicon carbide substrate;
   an n-type epitaxial layer of n-type conductivity silicon carbide on the substrate;
   ohmic contacts on the n-type epitaxial layer that respectively define a source and a drain;
   a Schottky metal contact on the n-type epitaxial layer that is between the ohmic contacts and thereby between the source and the drain to form an active channel in the n-type epitaxial layer between the source and the drain when a bias is applied to the Schottky metal contact;
   a p-type layer of p-type conductivity silicon carbide between the substrate and the n-type epitaxial layer;
   an ohmic contact to the p-type layer; and
   wherein the p-type layer comprises:
      a first p-type layer; and
      a second p-type layer, wherein the first p-type layer has a doping concentration higher than a doping concentration of the second p-type layer.

120. A metal-semiconductor field-effect transistor comprising:
   a semi-insulating silicon carbide substrate which is substantially free of deep level dopants;
   a buffer layer of silicon carbide on the semi-insulating silicon carbide substrate;
   an n-type epitaxial layer on the buffer layer;
   a cap layer on the n-type epitaxial layer;
   ohmic contacts on the n-type epitaxial layer that respectively define a source and a drain;
   a first recess in the cap layer between the source and drain contacts;
   a second recess in the n-type epitaxial layer within the first recess;
   a Schottky metal contact on the n-type epitaxial layer that is between the ohmic contacts and thereby between the source and the drain to form an active channel in the n-type epitaxial layer between the source and the drain when a bias is applied to the Schottky metal contact, wherein the Schottky metal contact includes a layer of chromium on the n-type epitaxial layer in the second recess;
   wherein the n-type epitaxial layer forms a mesa having sidewalls extending into the n-type layer which define the periphery of the transistor; and
   an ONO passivation layer on the sidewalls of the mesa and exposed portions of the n-type epitaxial layer.

121. A transistor according to claim 120, wherein the buffer layer comprises a p-type epitaxial layer of selectively doped p-type conductivity silicon carbide between the substrate and the n-type epitaxial layer, wherein the p-type conductivity silicon carbide has a carrier concentration of from about $1\times10^{16}$ to about $1\times10^{17}$ cm$^{-3}$.

122. A transistor according to claim 120, wherein the buffer layer comprises undoped silicon carbide.

* * * * *